US007920402B2

(12) United States Patent
Katoh et al.

(10) Patent No.: US 7,920,402 B2
(45) Date of Patent: Apr. 5, 2011

(54) RESISTANCE VARIABLE MEMORY APPARATUS

(75) Inventors: Yoshikazu Katoh, Osaka (JP);
Kazuhiko Shimakawa, Osaka (JP);
Zhiqiang Wei, Osaka (JP)

(73) Assignee: Panasonic Corporation, Osaka (JP)

( * ) Notice: Subject to any disclaimer, the term of this patent is extended or adjusted under 35 U.S.C. 154(b) by 149 days.

(21) Appl. No.: 12/514,025

(22) PCT Filed: Nov. 16, 2007

(86) PCT No.: PCT/JP2007/072254
§ 371 (c)(1),
(2), (4) Date: May 7, 2009

(87) PCT Pub. No.: WO2008/059946
PCT Pub. Date: May 22, 2008

(65) Prior Publication Data
US 2010/0046270 A1 Feb. 25, 2010

(30) Foreign Application Priority Data
Nov. 17, 2006 (JP) ................................ 2006-310913

(51) Int. Cl.
*G11C 17/00* (2006.01)
*G11C 11/00* (2006.01)
(52) U.S. Cl. ..................... 365/100; 365/148; 365/189.16
(58) Field of Classification Search ................. 365/100, 365/148, 189.16, 189.06, 158, 163, 171, 365/173
See application file for complete search history.

(56) References Cited

U.S. PATENT DOCUMENTS

| 6,888,745 | B2 * | 5/2005 | Ehiro et al. | 365/158 |
| 6,970,385 | B2 * | 11/2005 | Sakakibara | 365/185.29 |
| 2004/0264244 | A1 | 12/2004 | Morimoto | |
| 2008/0123393 | A1 * | 5/2008 | Kinoshita | 365/148 |

FOREIGN PATENT DOCUMENTS

| JP | 2004-185756 | 7/2004 |
| JP | 2005-025914 | 1/2005 |
| WO | WO 2006/137111 A1 | 12/2006 |
| WO | WO 2007/080840 A1 | 7/2007 |

OTHER PUBLICATIONS

Baek, I.G. et al., "Highly Scalable Non-volatile Resistive Memory using Simple Binary Oxide Driven by Asymmetric Unipolar Voltage Pulses," IEEE 2004.

* cited by examiner

*Primary Examiner* — Richard Elms
*Assistant Examiner* — Hai Q Pham
(74) *Attorney, Agent, or Firm* — McDermott Will & Emery LLP

(57) ABSTRACT

A resistance variable memory apparatus (100) of the present invention is a resistance variable memory apparatus (100) using a resistance variable element (22) transitioning between plural resistance states in response to electric pulses of the same polarity, in which a series resistance setting unit (10) is configured to set a resistance value of the series current path and a parallel resistance setting unit (30) is configured to set a resistance value of a parallel current path such that the resistance values become resistance values at which a node potential is not larger than a second voltage level in a state where an electric pulse application device (50) is outputting a first electric pulse after the resistance variable element (22) has switched to the high-resistance state, and the node potential is not larger than a first voltage level in the state where the electric pulse application device (50) is outputting a second electric pulse after the resistance variable element (22) has switched to the low-resistance state.

8 Claims, 12 Drawing Sheets

RESISTANCE VARIABLE MEMORY APPARATUS

RELATED APPLICATIONS

This application is the U.S. National Phase under 35 U.S.C. §371 of International Application No. PCT/JP2007/072254, filed on Nov. 16, 2007, which in turn claims the benefit of Japanese Application No. 2006-310913, filed on Nov. 17, 2006, the disclosures of which Applications are incorporated by reference herein.

TECHNICAL FIELD

The present invention relates to a resistance variable memory apparatus. More particularly, the present invention relates to a resistance variable memory apparatus configured to write data to resistance variable elements utilizing a difference in a voltage level of electric pulses having the same polarity.

BACKGROUND ART

Nonvolatile memory apparatuses are commonly mounted in portable devices such as cellular phones or digital cameras and the use of them has being spreading at a rapid pace. In recent years, in many cases, audio data and image data have been used. Accordingly, there has been a strong demand for nonvolatile memory apparatuses which have larger capacities and operate at high speeds so as to store data at a speed substantially equal to the speed of a logic operation as in SRAM. Furthermore, in fields of nonvolatile memory apparatuses for use with portable devices, a demand for lower electric power consumption has been increasing.

At present, a major nonvolatile memory apparatus is a flash memory. The flash memory is configured to control electric charges accumulated on a floating gate to store data. It has been pointed out that since the flash memory has a structure for accumulating electric charges on the floating gate at a high electric field, there is a limitation to reduction of the size, and it is difficult to miniaturize the flash memory, which is required to provide a larger capacity. In addition, in the flash memory, specified blocks must be erased all at once for rewriting. Because of such a property, the flash memory requires a very long time for rewriting and has a limitation to an increase in the speed which has been demanded as described above.

As a nonvolatile memory apparatus in next generation capable of solving the above mentioned problem, there is a nonvolatile memory apparatus which uses a resistance variable element for storing data according to a change in electric resistance. As nonvolatile memories using resistance variable elements proposed currently, there are a MRAM (magnetic RAM), PRAM (phase-change RAM), ReRAM (resistive RAM), etc. It has been reported that especially the ReRAM causes a simple phenomenon in which the resistance value changes according to electric pulses and provides high-speed performance in which writing occurs with several tens nseck or less. That is, there is a likelihood that an ultimate memory apparatus which has nonvolatility and operates at a high speed as in the SRAM as described above is attainable using the ReRAM.

Patent document 1 discloses an example of a control method of the ReRAM element (hereinafter also referred to as a resistance variable element) using an oxide of perovskite structure. Now, the control method of the ReRAM element will be described with reference to the drawings.

FIGS. 9 to 11 are views showing the control method of the memory cell disclosed in Patent document 1. A memory cell 9 includes a resistance variable element 1 and a selection transistor 2. One terminal of the resistance variable element 1 is electrically connected to one main terminal (drain or source) of the selection transistor 2. The other main terminal (source or drain) of the selection transistor 2 is electrically connected to a source line terminal 3 via a source line 6. The other terminal of the resistance variable element 1 is electrically connected to a bit line terminal 5 via a bit line 8. A gate of the selection transistor 2 is electrically connected to a word line terminal 4 via a word line 7. In any of the cases where data is written ("1" is written), data is erased ("0" is written) and data is read, a high-level ON-voltage is applied to the word line terminal 4 of the selected memory cell, causing the selection transistor 2 to be placed in an electrically conductive state.

FIG. 9 is a view showing a state of application of voltage pulses during a write operation in the memory cell of Patent document 1. The source line 6 is set to 0V (electrically grounded), and a positive write pulse having a predetermined write voltage amplitude is applied to the bit line 8 to write desired data to the resistance variable element 1. In the case where multi-valued data is written to the resistance variable element 1, a voltage amplitude of a write pulse is set to a level according to the value of data to be written. For example, in the case where four-valued data is written to one resistance variable element 1, one voltage amplitude is selected from among specified four voltage amplitudes determined to respectively correspond to the values of the write data and a write operation is performed. As a write pulse width, a proper width according to the element is selected. That is, to change the element 1 to a predetermined resistance state, one voltage amplitude level and one pulse width corresponding to the resistance state exist.

FIG. 10 is a view showing a state of application of voltage pulses during an erase operation in the memory cell of Patent document 1. The bit line is set to 0V (electrically grounded) and a positive erase pulse having a predetermined erase voltage amplitude is applied to the source line. With the application of the erase pulse, the electric resistance of the resistance variable element 1 is caused to have a minimum value. Patent document 1 discloses that, upon application of the erase pulse to a specified source line with plural bit lines set to 0V, data are erased all at once from plural memory cells connected to the plural bit lines and to the source line.

FIG. 11 is a view showing a state of application of a voltage pulse during a read operation in the memory cell of Patent document 1. When reading data stored in the resistance variable element 1, the source line 6 is set to 0V (electrically grounded), and a predetermined read voltage is applied to the selected bit line 8 via a read circuit. Upon application of the read voltage, a comparison/determination circuit compares a level of the bit line 8 to a reference level for reading, and stored data is read.

Non-patent document 1 discloses a ReRAM element configured to transition between a high-resistance state and a low-resistance state by application of voltage pulses having the same polarity and different voltages and pulse widths. TMO (transition metal oxide) is used as a resistance variable material for the ReRAM element of Non-patent document 1. The ReRAM element is capable of being changed to a high-resistance state or to a low-resistance state in response to the electric pulses of the same polarity. FIG. 12 is a view showing a voltage-current characteristic of the ReRAM element of Non-patent document 1. As shown in FIG. 12, in "SET" in which the element is switched from the high-resistance state to the low-resistance state, a more current than before flows when the element has been switched from the high-resistance state to the low-resistance state unless a set current compliance is used. In this case, even though the ReRAM element has been switched from the high-resistance state to the low-resistance state, re-switching of the resistance state may occur, in which the element switches from the low-resistance state to the high-resistance state unexpectedly (incorrect operation), or the element may be broken due to an excess current. Non-patent document 1 discloses that it is necessary to use a set current compliance of a first predetermined current value (upper limit value of a current in the set current compliance in FIG. 12).

Patent document 1: Japanese Laid-Open Patent Application Publication No. 2004-185756

Non-patent document 1: Baek, I. G. et al., 2004, "Highly Scalable Non-volatile Resistive Memory using Simple Binary Oxide Driven by Asymmetric Unipolar Voltage Pulses", 0-7803-8684-1/04/$20.00IEEE

DISCLOSURE OF THE INVENTION

Problems to be Solved by the Invention

The flash memory which is a major nonvolatile memory apparatus at present, among the above mentioned prior arts, has a problem that the processing speed is slow since the data are erased all at once prior to writing data. For this reason, in the flash memory, the nonvolatility and the high-speed which is substantially equal to the speed of the SRAM are not compatible with each other.

As described above, there is a likelihood that a high-speed nonvolatile memory is attainable using the resistance variable element. However, the resistive random access memory element of Non-patent document 1 has a problem that since it transitions between plural resistance states in response to the electric pulses of the same polarity, the set current compliance is needed just after the resistance value has decreased to prevent the incorrect operation or the break of the element, making the apparatus configuration complicated. In addition, the resistive random access memory element of Non-patent document 1 has a problem that the incorrect operation or the break of the element when writing data cannot be prevented completely even if using the complicated configuration.

The present invention has been directed to solving the above mentioned problems, and an ultimate object of the present invention is to provide a resistance variable memory apparatus capable of improving a processing speed by using a resistance variable element which does not require erasing data all at once when writing the data. Accordingly, an object of the present invention is to provide a resistance variable memory apparatus which is capable of surely preventing the incorrect operation or the break of an element when writing data with a simple configuration using a resistance variable element configured to transition between plural resistance states in response to electric pulses of the same polarity.

Means for Solving the Problem

The inventors studied intensively to surely prevent the incorrect operation and break of the element when writing data in the nonvolatile memory apparatus (resistance variable memory apparatus) using the resistance variable element, and as a result, found out the following.

As described above, in the resistance variable element disclosed in Non-patent document 1, in "SET" in which the element is switched from the high-resistance state to the low-resistance state, it is necessary to use a set current compliance at a first current value. On the other hand, in "RESET" in which the element is switched from the low-resistance state to the high-resistance state, it is necessary to conduct a current at a second current value (current value at which the element switches from the low-resistance state to the high-resistance state in FIG. 12) which is larger than the first current value.

Since the resistance variable element of Non-patent document 1 is switched to the high-resistance state or to the low-resistance state by application of the voltages of the same polarity (unipolar type or non-polar type), it is necessary to control the first current capacity (in the case of "SET") and the second current capacity (in the case of "RESET") respectively when writing data. However, it was discovered that the incorrect operation occurs merely by using the set current compliance associated with the first current capacity. The detail will be described below.

A drive circuit for use in writing to the nonvolatile memory apparatus usually includes one or more transistors. It is difficult to completely eliminate the ON-resistances of the transistors in a recent semiconductor process adapted for miniaturization. The ON-resistance is several hundreds $\Omega$ to several kilos $\Omega$ although it depends on a gate width. Therefore, the output impedance of the drive circuit is inevitably several hundreds $\Omega$ or larger. On the other hand, typically, the resistance value of the resistance variable element in the low-resistance state is several hundreds $\Omega$ to several kilos $\Omega$, while the resistance value of the resistance variable element in the high-resistance state is several tens kilos $\Omega$ to several hundreds kilos $\Omega$.

The voltage applied to both ends of the element is determined by the output voltage of a voltage source excluding the transistor in the drive circuit and the voltage-dividing relationship (distribution relationship of the applied voltage according to the resistance value) between the transistor and the element. When the element is in the low-resistance state, the voltage applied to the element is significantly lower than the output voltage of the voltage source, because the resistance value (several hundreds $\Omega$ to several kilos $\Omega$) of the element in the low-resistance state is relatively close to the ON-resistance (several hundreds $\Omega$ to several kilos $\Omega$) of the transistor included in the drive circuit. To switch the resistance variable element in the low-resistance state to the high-resistance state, it is necessary to apply to the both ends of the element a voltage which is a predetermined voltage (threshold) or larger. Therefore, in writing of data ("RESET") from the low-resistance state to the high-resistance state, it is necessary to output from the voltage source a voltage which is significantly larger than the threshold to apply the element a voltage required for writing.

If the element switches from the low-resistance state to the high-resistance state under the state where the above mentioned high-voltage is output, a problem arises. Since the resistance value (several tens kilos $\Omega$ to several hundreds kilos $\Omega$) of the element in the high-resistance state is significantly larger than the ON-resistance (several hundreds $\Omega$ to several kilos $\Omega$) of the transistor included in the drive circuit, substantially the entire of the output voltage is directly applied to the element. In the worst case, the voltage applied to the both ends of the element rapidly increases up to a voltage value which is equal to a product of the resistance value of the element and the second current capacity, as the element switches from the low-resistance state to the high-resistance state. If the increased voltage is beyond the voltage required to switch the element from the high-resistance state to the low-resistance state, an incorrect operation occurs. That is, although the element has been switched from the low-resistance state to the high-resistance state once, it returns from the high-resistance state to the low-resistance state unexpectedly. Or, the element may be broken due to an excess voltage applied. The problems of the incorrect operation and the break of the element during the "RESET" are not disclosed in the prior art documents, but were found out by the inventors.

In summary, in the nonvolatile memory apparatus using the resistance variable element of the type (unipolar type/non-polar type) which is configured to switch to the high-resistance state or to the low-resistance state by application of the voltages of the same polarity, a properly set current compliance must be used during "SET" in which the element is switched from the high-resistance state to the low-resistance state, and a properly set voltage compliance must be used during "RESET" in which the element is switched from the low-resistance state to the high-resistance state, in order to prevent the incorrect operation or the break of the element. In addition, such a configuration is desirably achieved with a simple apparatus construction.

To achieve the above described objective, a resistance variable memory apparatus of the present invention comprises a resistance variable element for storing data based on a change in an electric resistance; an electric pulse application device including a first output terminal and a second output terminal, the electric pulse application device being configured to output an electric pulse between the first output terminal and the second output terminal; a reference node; a series current path for electrically connecting the first output terminal to the reference node; a resistance change current path including the resistance variable element and electrically connecting the reference node to the second output terminal via the resistance variable element; a parallel current path for electrically connecting the reference node to the second output terminal in parallel with the resistance change current path; a series resistance setting unit for setting a resistance value of the series current path; and a parallel resistance setting unit for setting a resistance value of the parallel current path; wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level; and wherein the series resistance setting unit is configured to set a resistance value of the series current path and the parallel resistance setting unit is configured to set a resistance value of the parallel current path such that: a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state, become resistance values at which the node potential is not smaller in absolute value than the first voltage level when the resistance variable element is in the low-resistance state and the electric pulse application device outputs a first electric pulse; become resistance values at which the node potential is not smaller in absolute value than the second voltage level when the resistance variable element is in the high-resistance state and the electric pulse application device outputs a second electric pulse; become resistance values at which the node potential is not larger in absolute value than the second voltage level in a state where the electric pulse application device is outputting the first electric pulse after the resistance variable element has switched to the high-resistance state when the resistance variable element is in the low-resistance state and the electric pulse application device outputs the first electric pulse; and become resistance values at which the node potential is not larger in absolute value than the first voltage level in a state where the electric pulse application device is outputting the second electric pulse after the resistance variable element has switched to the low-resistance state when the resistance variable element is in the high-resistance state and the electric pulse application device outputs the second electric pulse.

With such a configuration, a resistance variable memory apparatus is provided, which does not require erasing data all at once when writing data and improves a processing speed. In addition, it is possible to surely prevent an incorrect operation or break of the element when writing data with a simple configuration, using the resistance variable element transitioning between plural resistance states in response to the electric pulses having the same polarity.

In the resistance variable memory apparatus, when a resistance value of the series current path which occurs when the resistance variable element is switched from the low-resistance state to the high-resistance state is expressed as $Rsl$, a resistance value of the series current path which occurs when the resistance variable element is switched from the high-resistance state to the low-resistance state is expressed as $Rsh$, a resistance value of the parallel current path which occurs when the resistance variable element is switched from the low-resistance state to the high-resistance state is expressed as $Rpl$, a resistance value of the parallel current path which occurs when the resistance variable element is switched from the high-resistance state to the low-resistance state is expressed as $Rph$, a resistance value of the resistance change current path which occurs in a state where the resistance variable element is in the low-resistance state is expressed as $Rrl$, a resistance value of the resistance change current path which occurs in a state where the resistance variable element is in the high-resistance state is expressed as $Rrh$, an absolute value of a potential of the first output terminal based on the second output terminal as a reference which occurs when the first electric pulse is output is expressed as $V1$, an absolute value of a potential of the first output terminal based on the second output terminal as a reference which occurs when the second electric pulse is output is expressed as $V2$, an absolute value of the first voltage level is expressed as $Vlh$, and an absolute value of the second voltage level is expressed as $Vhl$, formulae (1) to (4) expressed below may be satisfied:

$$\frac{V1 \times Rpl - Vlh \times Rpl}{Vlh + \frac{Vlh \times Rpl}{Rrl}} \geq Rsl \quad (1)$$

$$\frac{V1 \times Rpl - Vhl \times Rpl}{Vhl + \frac{Vhl \times Rpl}{Rrh}} < Rsl \quad (2)$$

$$\frac{V2 \times Rph - Vhl \times Rph}{Vhl + \frac{Vhl \times Rph}{Rrh}} \geq Rsh \quad (3)$$

-continued $$\frac{V2 \times Rph - Vlh \times Rph}{Vlh + \frac{Vlh \times Rph}{Rrl}} < Rsh \qquad (4)$$

In such a configuration, it is possible to design a circuit specifically using a voltage-dividing relationship which is calculated from the resistance values of the current paths. Therefore, it is possible to more surely prevent the incorrect operation or the break of the element when writing the data.

In the resistance variable memory apparatus, the series resistance setting unit may be configured to selectively turn on switches of a plurality of current paths which are provided on the series current path in parallel with each other, to set the resistance value of the series current path, the plurality of current paths each including a fixed resistance element and a switch; and the parallel resistance setting unit may be configured to selectively turn on switches of a plurality of current paths which are provided on the series current path in parallel with each other, to set the resistance value of the parallel current path, the plurality of current paths each including a fixed resistance element and a switch.

In such a configuration, using the fixed resistance elements, the resistance values of the current paths can be easily controlled.

In the resistance variable memory apparatus, the series resistance setting unit may be configured to selectively turn on transistors included in a plurality of current paths which are provided on the series current path in parallel with each other, to set the resistance value of the series current path, the transistors having different ON-resistances; and the parallel resistance setting unit may be configured to selectively turn on transistors included in a plurality of current paths which are provided on the series current path in parallel with each other, to set the resistance value of the parallel current path, the transistors having different ON-resistances.

In such a configuration, since the transistors function as the resistors and the switches, a circuit configuration is simplified. In addition, the resistance value of the series current path and the resistance value of the parallel current path can be easily set to desired values by controlling the gate width and gate length of the transistors. Therefore, the resistance values of the current paths can be easily controlled by using an integration technique using a semiconductor process.

The resistance variable memory apparatus may further comprise a controller. The controller may be configured to control the series resistance setting unit and the parallel resistance setting unit based on a signal externally input, to set the resistance value of the series current path and the resistance value of the parallel current path, when the electric pulse application device outputs an electric pulse.

In such a configuration, since the resistance variable memory apparatus includes the controller, the external system has only to input an operation command, an address, and write data, to enable writing and reading of the data. Therefore, the resistance variable memory apparatus is flexibly adapted to external systems having various interfaces and communication protocols.

A write once resistance variable memory apparatus of the present invention comprise a resistance variable element for storing data based on a change in an electric resistance; an electric pulse application device including a first output terminal and a second output terminal, the electric pulse application device being configured to output an electric pulse between the first output terminal and the second output terminal; a reference node; a series current path for electrically connecting the first output terminal to the reference node; a resistance change current path including the resistance variable element and electrically connecting the reference node to the second output terminal via the resistance variable element; and a parallel current path for electrically connecting the reference node to the second output terminal in parallel with the resistance change current path; wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level; wherein a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state, become resistance values at which the node potential is not smaller in absolute value than the first voltage level when the resistance variable element is in the low-resistance state and the electric pulse application device outputs a first electric pulse; and the resistance values, become resistance values at which the node potential is not larger in absolute value than the second voltage level in a state where the electric pulse application device is outputting the first electric pulse after the resistance variable element has switched to the high-resistance state when the resistance variable element is in the low-resistance state and the electric pulse application device outputs the first electric pulse.

In such a configuration, it is possible to prevent the incorrect operation or the break of the element when writing data with a simpler configuration, using the resistance variable element transitioning between plural resistance states in response to the electric pulses having the same polarity. In addition, because of the presence of the parallel current path, it is possible to stabilize the absolute value of the node potential even if the resistance value of the resistance variable element fluctuates. Thus, reliability is improved.

A write once resistance variable memory apparatus of the present invention comprises: a resistance variable element for storing data based on a change in an electric resistance; an electric pulse application device including a first output terminal and a second output terminal, the electric pulse application device being configured to output an electric pulse between the first output terminal and the second output terminal; a reference node; a series current path for electrically connecting the first output terminal to the reference node; a resistance change current path including the resistance variable element and electrically connecting the reference node to the second output terminal via the resistance variable element; and a parallel current path for electrically connecting the reference node to the second output terminal in parallel with the resistance change current path; wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level; wherein a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state, become resistance values at which the node potential is not smaller in absolute value than the second voltage level when the resistance variable element is in the high-resistance state and the electric pulse application device outputs a second electric pulse; and become resistance values at which the node potential is not larger in absolute value than the first voltage level in a state where the electric pulse application device is outputting the second electric pulse after the resistance variable element has switched to the low-resistance state when the resistance variable element is in the high-resistance state and the electric pulse application device outputs the second electric pulse.

In such a configuration, it is possible to prevent the incorrect operation or the break of the element when writing data with a simpler configuration, using the resistance variable element transitioning between plural resistance states in response to the electric pulses having the same polarity. In addition, because of the presence of the parallel current path, it is possible to stabilize the absolute value of the node potential even if the resistance value of the resistance variable element fluctuates. Thus, reliability is improved.

A resistance variable element including a first resistance terminal and a second resistance terminal, the resistance variable element being configured to store data based on a change in an electric resistance between the first resistance terminal and the second resistance terminal;

A write once resistance variable memory apparatus of the present invention apparatus comprises; an electric pulse application device including a first output terminal and a second output terminal, the electric pulse application device being configured to output an electric pulse between the first output terminal and the second output terminal; a series current path for electrically connecting the first output terminal to the first resistance terminal; and a resistance change current path including the resistance variable element and electrically connecting the first resistance terminal to the second output terminal via the resistance variable element; wherein the resistance variable element has a characteristic in which the resistance variable element in a high-resistance state switches to a low-resistance state, a resistance value of which is lower than a resistance value of the high-resistance state, when a potential at a predetermined point on the series current path based on the second output terminal as a reference is larger in absolute value than a third voltage level, and the resistance variable element in the low-resistance state switches from the low-resistance state to the high-resistance state when the potential is larger in absolute value than a fourth voltage level which has a polarity identical to a polarity of the third voltage level and is smaller in absolute value than the third voltage level; and wherein when a resistance value of the series current path is expressed as Rs, a resistance value of the resistance change current path in a state where the resistance variable element is in the low-resistance state is expressed as Rrl, a resistance value of the resistance change current path in a state where the resistance variable element is in the high-resistance state is expressed as Rrh, an absolute value of a potential of the first output terminal based on the second output terminal as a reference which occurs when the third electric pulse is output, is expressed as V3, an absolute value of the third voltage level is expressed as Vhl,' and an absolute value of the fourth voltage level is expressed as Vlh', a formula (7) and a formula (8) expressed below are satisfied:

$$\frac{(V3 - Vhl') \times Rrh'}{Vhl'} \geq Rs \quad (7)$$

$$\frac{(V3 - Vlh') \times Rrl'}{Vlh'} < Rs \quad (8)$$

In such a configuration, "write once" manner is used, and the switching only from the high-resistance state which is an initial state to the low-resistance state is caused to take place. Thereby, the parallel current path may be omitted. Therefore, it is possible to prevent the incorrect operation or the break of the element when writing data with a very simple configuration, using the resistance variable element transitioning between plural resistance states in response to the electric pulses having the same polarity. Also, it is possible to design a circuit specifically using a voltage-dividing relationship which is calculated from the resistance values of the current paths. Therefore, it is possible to more surely prevent the incorrect operation or the break of the element when writing the data.

The above and further objects, features and advantages of the present invention will more fully be apparent from the following detailed description of preferred embodiments with reference to accompanying drawings.

EFFECTS OF THE INVENTION

The present invention has the above described configuration and advantages as follows. That is, it is possible to provide a resistance variable memory apparatus which does not require erasing data all at once when writing data and improves a processing speed. Also, it is possible to provide a resistance variable memory apparatus which is capable of surely preventing an incorrect operation or break of the element when writing data with a simple configuration, using the resistance variable element transitioning between plural resistance states in response to the electric pulses having the same polarity.

Figure 1:
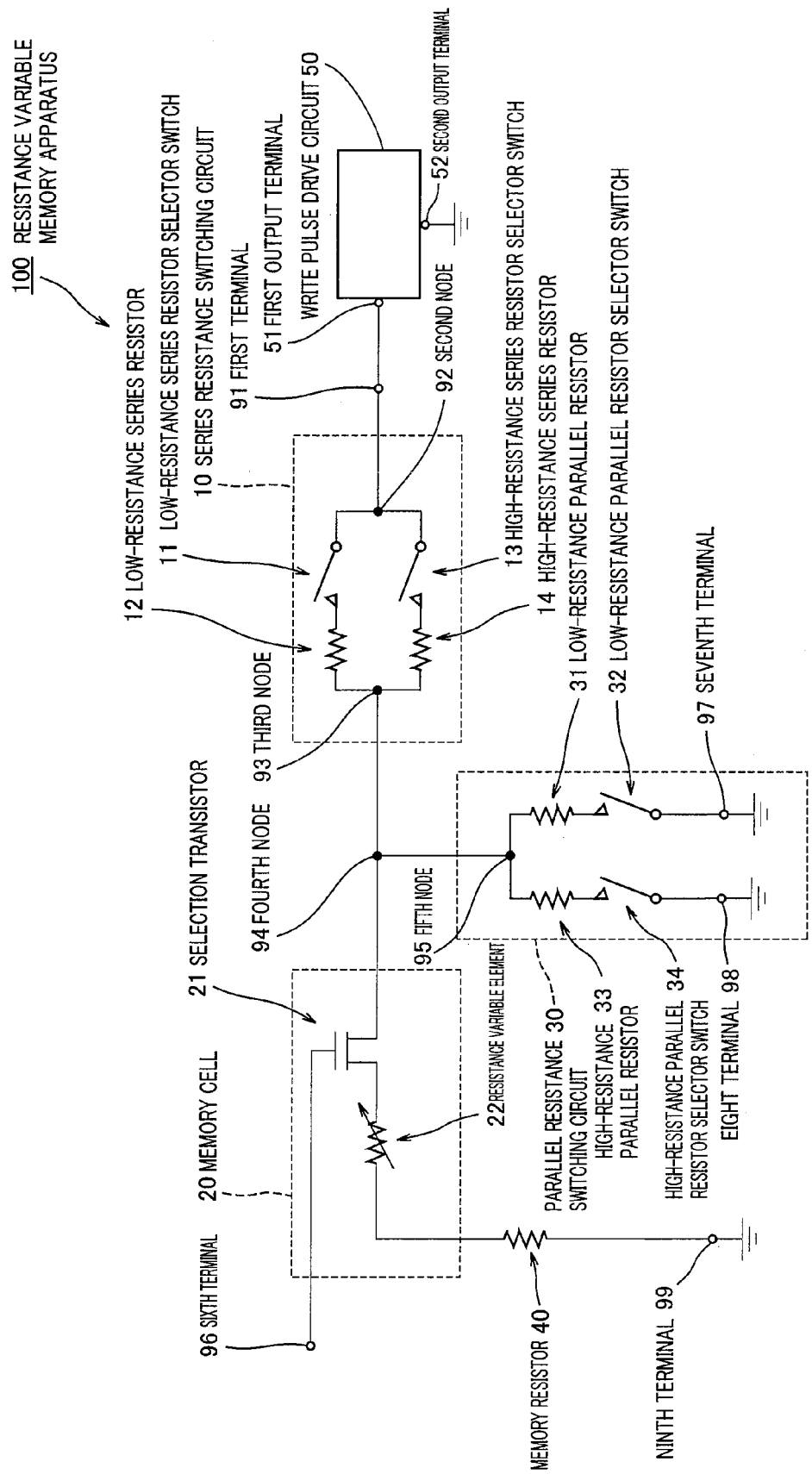
FIG. 1 is a wiring diagram showing an example of a resistance variable memory apparatus according to Embodiment 1 of the present invention.

DESCRIPTION OF REFERENCE NUMBERS 1 resistance variable element
2 selection transistor
3 source line terminal
4 word line terminal
5 bit line terminal
6 source line
7 word line
8 bit line
9 memory cell
10 series resistance switching circuit
11 low-resistance series resistor selector switch
12 low-resistance series resistor
13 high-resistance series resistor selector switch
14 high-resistance series resistor
15 series resistance switching circuit
16 low-resistance series transistor
17 high-resistance series transistor
20 memory cell
21 selection transistor
22 resistance variable element
30 parallel resistance switching circuit
31 low-resistance parallel resistor
32 low-resistance parallel resistor selector switch
33 high-resistance parallel resistor
34 high-resistance parallel resistor selector switch
35 parallel resistance switching circuit
36 low-resistance parallel transistor
37 high-resistance parallel transistor
40 memory resistor
50 write pulse drive circuit
51 first output terminal
52 second output terminal
60 write pulse generating circuit
62 write data decoder
64 host interface circuit
66 row decoder
68 word line driver
69 word line
70 memory cell array
71 bit line
72 read comparison/determination circuit
73 source line
74 switch controller
75 multi-switch circuit
76 element current detection resistor
77 amplification circuit
78 comparator
79 element state detection circuit
80 controller
81 first terminal
82 second node
83 third node
84 fourth node
85 fifth node
86 sixth terminal
87 seventh terminal
88 eighth terminal
91 first terminal
92 second node
93 third node
94 fourth node
95 fifth node
96 sixth terminal
97 seventh terminal
98 eighth terminal
99 ninth terminal
100 resistance variable memory apparatus
200 resistance variable memory apparatus
300 resistance variable memory apparatus
400 resistance variable memory apparatus
500 resistance variable memory apparatus

BEST MODE FOR CARRYING OUT THE INVENTION

Hereinafter, preferred embodiments of the present invention will be described with reference to the drawings.

Embodiment 1

[Configuration]

FIG. 1 is a wiring diagram showing an example of a resistance variable memory apparatus according to Embodiment 1 of the present invention. Hereinafter, with reference to FIG. 1, a resistance variable memory apparatus 100 of this embodiment will be described.

As shown in FIG. 1, the resistance variable memory apparatus 100 comprises, as major constituents, a series resistance switching circuit 10 (series resistance setting unit), a memory cell 20, a parallel resistance switching circuit 30 (parallel resistance setting unit), and a write pulse drive circuit 50 (electric pulse application device).

The series resistance switching circuit 10 includes a low-resistance circuit including a low-resistance series resistor selector switch 11 and a low-resistance series resistor 12, and a high-resistance circuit including a high-resistance series resistor selector switch 13 and a high-resistance series resistor 14. These circuits are connected in parallel with each other to a second node 92 and a third node 93 (as used herein, the term "connected" means "electrically connected," and the same applies hereinafter). The second node 92 is connected to a first terminal 91. The third node 93 is connected to a fourth node 94 (reference node). The low-resistance series resistor selector switch 11 and the high-resistance series resistor selector switch 13 are each configured to be turned ON/OFF selectively by a controller (not shown). When the low-resistance series resistor selector switch 11 is placed in an ON-state, the high-resistance series resistor selector switch 13 is placed in an OFF-state. When the high-resistance series resistor selector switch 13 is placed in an ON-state, the low-resistance series resistor selector switch 11 is placed in an OFF-state. Note that the second node 92 and the third node 93 are merely illustrated as nodes. The two circuits (low-resistance circuit and high-resistance circuit) may directly branch from the first terminal 91 and from the fourth node 94, respectively.

The memory cell 20 includes a selection transistor 21 and a resistance variable element 22. One main terminal (source or drain) of the selection transistor 21 is connected to the fourth node 94, the other main terminal thereof is connected to one end of the resistance variable element 22, and a gate thereof is connected to a six terminal 96. The other end of the resistance variable element 22 is connected to the ninth terminal 99 via a memory resistor 40. The ninth terminal 99 is electrically grounded. The selection transistor 21 is turned ON/OFF under control of the controller (not shown). In FIG. 1, only one memory cell 20 is shown in FIG. 1 for the sake of description, but a memory cell array including a plurality of memory cells 20 may be formed. A known technique may be employed as a method for selecting a specified memory cell 20 using the selection transistor 21 from the memory cell array.

The parallel resistance switching circuit 30 includes a low-resistance circuit including a low-resistance parallel resistor 31 and a low-resistance parallel resistor selector switch 32, and a high-resistance circuit including a high-resistance parallel resistor 33 and a high-resistance parallel resistor selector switch 34. These circuits are connected in parallel with each other to a fifth node 95. A seventh terminal 97 and an eighth terminal 98 are respectively provided at the other ends of the circuits and are respectively electrically grounded. The low-resistance parallel resistor selector switch 32 and the high-resistance parallel resistor selector switch 34 are each configured to be turned ON/OFF selectively by the controller (not shown). When the low-resistance parallel resistor selector switch 32 is placed in an ON-state, the high-resistance parallel resistor selector switch 34 is placed in an OFF-state. When the high-resistance parallel resistor selector switch 34 is placed in an ON-state, the low-resistance parallel resistor selector switch 32 is placed in an OFF-state. Note that the fifth node 95 is merely illustrated as a node. The two circuits (low-resistance circuit and high-resistance circuit) may directly branch from the fourth node 94.

The write pulse drive circuit 50 includes a first output terminal 51 and a second output terminal 52. The write pulse drive circuit 50 is configured to apply an electric pulse having a predetermined voltage and a predetermined time width between the first output terminal 51 and the second output terminal 52 under the control of the controller (not shown). The first output terminal 51 is connected to the first terminal 91 and the second output terminal 52 is electrically grounded.

The selection transistor 21 is, in this embodiment, a transistor such as MOS-FET. Upon an ON-voltage being applied to the gate of the selection transistor 21 via the sixth terminal 96, an electric resistance (to be precise, impedance) between two main terminals decreases, allowing the selection transistor 21 to be placed in an electrically conductive state.

The resistance variable element 22 is, in this embodiment, a ReRAM element. The ReRAM element has a characteristic in which its resistance value changes in response to electric stress applied and maintains the changed resistance value after it is released from the electric stress. Using this characteristic, the ReRAM element stores data in a nonvolatile manner. The ReRAM element has a structure in which, for example, a thin-film material of an oxide having a spinel structure such as $COFe_2O_4$, $Co_xMn_{3-x}O_4$, $(Co_{1-x}Zn_x)Fe_2O_4$, $(Ni_{1-x}Zn_x)Fe_2O_4$, $NiCr_2O_4$, $Cu_{0.15}Ni_{0.85}$, $Cr_2O_4$, $Mn_3O_4$, $ZnMn_2O_4$, $ZnV_2O_4$, $Fe_3O_4$, $AlV_2O_4$, $ZnCr_2O_4$, $ZnFe_2O_4$ or $ZnGa_2O_4$, an oxide having a perovskite structure, or a thin-film material of an oxide using Ni or Ti, is sandwiched between predetermined electrode materials.

The resistance variable element 22 of this embodiment transitions between a low-resistance state and a high-resistance state according to predetermined electric pulses. By respectively allocating the resistance states to the data, the data is stored. In this embodiment, it is supposed that the high-resistance state is allocated to "0," while the low-resistance state is allocated to "1." One feature of the resistance variable element 22 is that writing (writing of "1") and erasing (writing of "0") are performed with the electric pulses of the same polarity. In the case of application of a positive electric pulse, the resistance variable element 22 in the low-resistance state switches from the low-resistance state to the high-resistance state upon a positive voltage which is equal in absolute value to or larger in absolute value than a predetermined value (first value) being applied to the both ends thereof. The resistance variable element 22 in the high-resistance state switches from the high-resistance state to the low-resistance state upon a positive voltage which is in absolute value equal to or larger than another value (second value) which is larger than the first value is applied to the both ends thereof. In the case of application of a negative electric pulse, the resistance variable element 22 in the low-resistance state switches from the low-resistance state to the high-resistance state upon a negative voltage which is equal in absolute value to or larger in absolute value than a predetermined value (third value) being applied to the both ends thereof. The resistance variable element 22 in the high-resistance state switches from the high-resistance state to the low-resistance state upon a negative voltage which is in absolute value equal to or larger than another value (fourth value) which is larger than the first value is applied to the both ends thereof. Note that the first value may be equal in absolute value to the third value and the second value may be equal in absolute value to the fourth value.

Whereas the low-resistance series resistor selector switch 11, the high-resistance series resistor selector switch 13, the low-resistance parallel resistor selector switch 32, and the high-resistance parallel resistor selector switch 34 are illustrated as the switches in the drawings for the purpose of explanation, they may alternatively be constituted by transistors such as MOS-FETs.

The low-resistance series resistor 12, the high-resistance series resistor 14, the low-resistance parallel resistor 31, the high-resistance parallel resistor 33, and the memory resistor 40 are illustrated as fixed resistance elements in the drawings for the purpose of explanation. It is needless to say that the fixed resistance elements are illustrated for convenience to collectively show the resistance values on current paths including the switches (including ON-resistances of the transistors), wires and others, and the values of them should be off course considered as an actual value of a total impedance according to a frequency band of the electric pulse for driving, including a capacitive impedance. As the resistors, the fixed resistance elements need not be provided actually, but desired impedances may be set using wire resistance, ON-resistances of the switches, wire capacities, etc (hereinafter the same applies to the embodiments described below).

Hereinafter, the relationship between the resistance values of the current paths and the voltages which is one feature of the resistance variable memory apparatus 100 will be described.

The current path connecting the first terminal 91 to the fourth node 94 (reference node) has a series connection relationship with the memory cell 20, supposing that the current path from the first terminal 91 to a ground point (second output terminal 52) is one current path. Accordingly, this current path is referred to as a series current path. The resistance value of the series current path (current path connecting 91, 92, 11, 12, 93, and 94 in turn in FIG. 1) passing through the low-resistance series resistor 12 with the low-resistance series resistor selector switch 11 being in an ON-state and the high-resistance series resistor selector switch 13 being in an OFF-state is expressed as Rsl. The resistance value of the series current path (current path connecting 91, 92, 13, 14, 93, and 94 in turn in FIG. 1) passing through the high-resistance series resistor 14 with the high-resistance series resistor selector switch 13 being in an ON-state and the low-resistance series resistor selector switch 11 being in an OFF-state is expressed as Rsh. Rsl includes the wire resistance, the ON-resistance of the low-resistance series resistor selector switch 11, and the like in addition to the resistance of the low-resistance series resistor 12 (including impedance of the write pulse drive circuit 50 if the impedance should be taken into account). Also, Rsh includes the wire resistance, the ON-resistance of the high-resistance series resistor selector switch 13, and the like in addition to the resistance of the high-resistance series resistor 14 (including impedance of the write pulse drive circuit 50 if the impedance should be taken into account). It is supposed that the resistance between the first output terminal 51 and the first terminal 91 is negligible. A maximum current determined by the pulse voltage output from the write pulse drive circuit 50 and the impedance selected by the series resistance switching circuit 10 assuming that the impedance of the write pulse drive circuit 50 is zero is a maximum current capacity (current capacity of the drive circuit) to be flowed in the element. As a matter of course, the impedance is suitably a part of the resistance of the series current path and a specified current capacity is attained, if the impedance of the write pulse drive circuit 50 is not zero.

The current path (current path connecting 94, 21, 22, 40, 99 and 52 in turn in FIG. 1) connecting the fourth node 94 (reference node) to the ninth terminal 99 (and second output terminal 52) with the selection transistor 21 being in an ON-state is referred to as a resistance change current path. The resistance value of the resistance change current path in the case where the resistance variable element 22 is in the low-resistance state is expressed as Rrl and the resistance value of the resistance change current path in the case where the resistance variable element 22 is in the high-resistance state is expressed as Rrh. Rrl and Rrh each includes the wire resistance, the ON-resistance of the selection transistor 21, the resistance of the memory resistor 40, and the like in addition to the resistance of the resistance variable element 22.

The current path connecting the fourth node 94 (reference node) to the ground point (seventh terminal 97 or eighth terminal 98) form a parallel positional relationship with the memory cell 20, supposing that the current path from the first terminal 91 to the ground point (97, 98, 99, 52) is one current path. Accordingly, this current path is referred to as a parallel current path. The resistance value of the parallel current path (current path connecting 94, 95, 31, 32, 97, and 52 in turn in FIG. 1) passing through the low-resistance parallel resistor 31 with the low-resistance parallel resistor selector switch 32 being in an ON-state and the high-resistance parallel resistor selector switch 34 being in an OFF-state is expressed as Rpl. The resistance value of the current path (current path connecting 94, 95, 33, 34, 98 and 52 in turn in FIG. 1) passing through the high-resistance parallel resistor 33 with the high-resistance parallel resistor selector switch 34 being in an ON-state and the low-resistance parallel resistor selector switch 32 being in an OFF-state is expressed as Rph. Rpl includes the wire resistance, the ON-resistance of the low-resistance parallel resistor selector switch 32, and the like, in addition to the resistance of the low-resistance parallel resistor 31. Rph includes the wire resistance, the ON-resistance of the high-resistance parallel resistor selector switch 34, and the like in addition to the resistance of the high-resistance parallel resistor 33.

Since the second output terminal 52, the seventh terminal 97, the eighth terminal 98 and the ninth terminal 99 are electrically grounded, they may be assumed to be connected to each other. To be specific, it may be considered that the resistance change current path is a current path connecting the fourth node 94 to the second output terminal 52 via the resistance variable element 22, and the parallel current path is a current path connecting the fourth node 94 to the second output terminal 52 in parallel with the resistance change current path.

Figure 12:
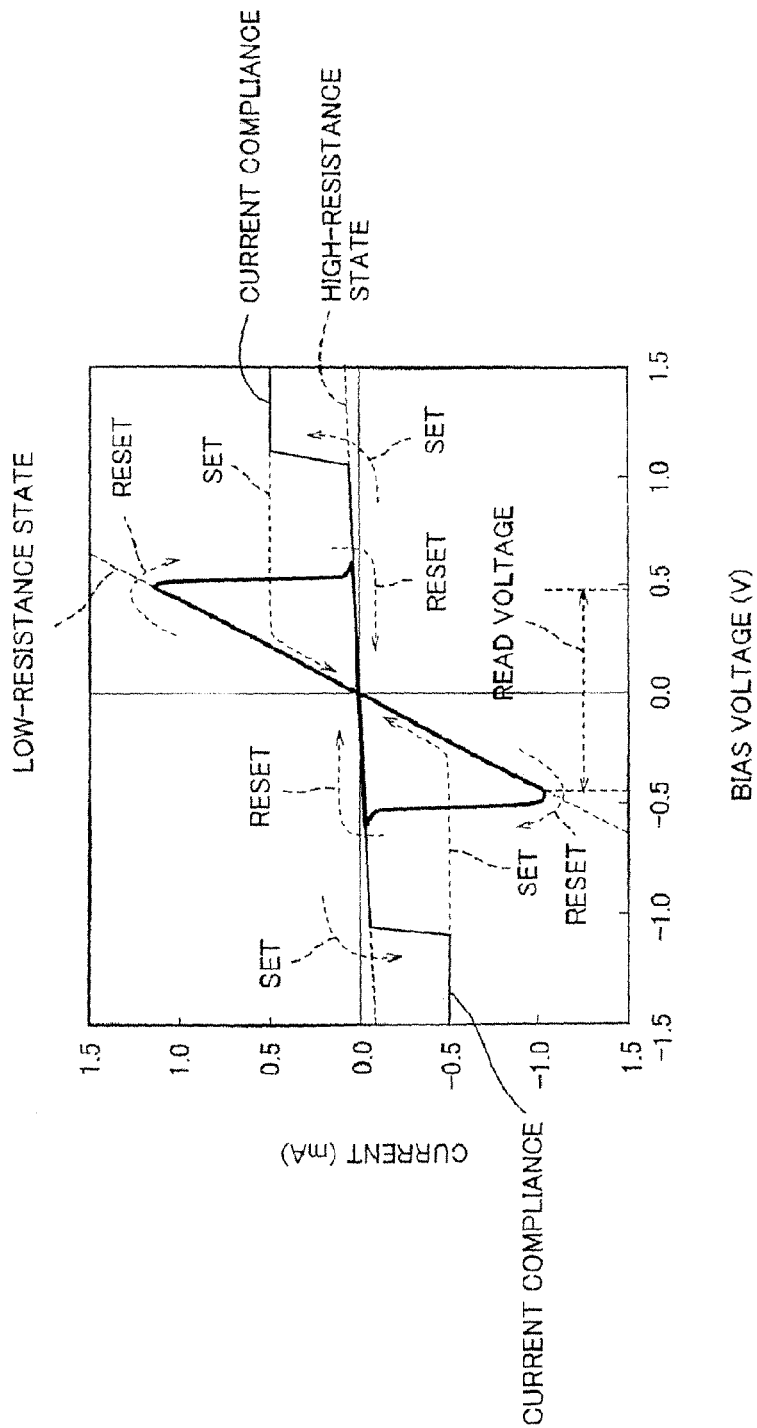
FIG. 12 is a view showing a voltage-current characteristic of a ReRAM element of Non-patent document 1.

The resistance variable element 22 has a current-voltage characteristic which is similar to that shown in FIG. 12, although its specific current value and voltage may be different. The potential of the fourth node 94 (reference node) is hereinafter referred to as the node potential. The absolute value of the node potential which is required to switch the resistance variable element 22 from the low-resistance state to the high-resistance state is expressed as Vlh (first voltage level). The absolute value of the node potential which is required to switch the resistance variable element 22 from the high-resistance state to the low-resistance state is expressed as Vhl (second voltage level). The two node potentials have the same polarity (signs are same). In this embodiment, the second voltage level is larger than the first voltage level (Vhl>Vlh). Note that the potentials are based on the ground points as a reference (the same applies hereinafter).

The absolute value of the voltage of the electric pulse (first electric pulse) applied by the write pulse drive circuit 50 to switch the resistance variable element 22 from the low-resistance state to the high-resistance state is expressed as V1. The voltage of the electric pulse applied from the write pulse drive circuit 50 is defined as a voltage before a potential drops due to impedance (such as ON-resistance of the transistor included in the write pulse drive circuit 50) of the write pulse drive circuit 50 (in other words, the impedance of the write pulse drive circuit 50 is supposed to be zero). As a matter of course, it may be considered that if the impedance of the write pulse drive circuit 50 is not zero, the impedance is included in the resistance of the series current path. To surely enable the element to switch to the high-resistance state, it is necessary that the absolute value of the node potential at the time when the first electric pulse is applied be Vlh or larger. When the condition which should be satisfied by the absolute value of the potential of the reference node and the resistance values is calculated under the above condition, the following formula (1) is derived. Note that Vlh is not always equal to the threshold of the voltage (absolute value) applied to the resistance variable element 22 (both ends of the resistance variable element 22). That is, the absolute value of the voltage applied to the resistance variable element 22 may be sometimes smaller than Vlh even when the absolute value of the node potential is Vlh, because the absolute value of the node potential is a voltage including a sum of a voltage drop generated due to the wire resistance, the ON-resistance of the transistor or the like, and the voltage applied to the both ends of the resistance variable element 22 for attaining the high-resistance state.

$$\frac{V1 \times Rpl - Vlh \times Rpl}{Vlh + \frac{Vlh \times Rpl}{Rrl}} \geq Rsl \quad (1)$$

The plurality of resistance variable elements 22 are arranged on the memory cell array, and therefore, there is a variation in their resistance change characteristics. In the case where an electric pulse having a specified width is applied to these elements, some of them, which operate at higher speeds, switch the resistances well in a front-half part of the width. In this case, even after the element has switched to the high-resistance state, they are applied with a voltage having an absolute value of V1 from the write pulse drive circuit 50. To prevent the resistance variable element 22 from returning to the low-resistance state or being broken, it is necessary to make the absolute value of the node potential less than Vhl quickly after the element has transitioned to the high-resistance state. When the condition which should be satisfied by the absolute value of the potential of the reference node and the resistance values is calculated under the above condition, the following formula (2) is derived:

$$\frac{V1 \times Rpl - Vhl \times Rpl}{Vhl + \frac{Vhl \times Rpl}{Rrh}} < Rsl \quad (2)$$

If the formula (2) is satisfied, rapid increase in the absolute value of the node potential can be prevented, because a current can be released to the parallel current path even when the resistance value of the resistance variable element 22 rises.

The absolute value of the voltage of the electric pulse (second electric pulse) applied from the write pulse drive circuit 50 to switch the resistance variable element 22 from the high-resistance state to the low-resistance state is expressed as V2. To enable the element 22 to surely switch to the low-resistance state, it is necessary that the absolute value of the node potential at the time when the second electric pulse is applied be Vhl or larger. When the condition which should be satisfied by the absolute value of the potential of the reference node and the resistance values is calculated under the above condition, the following formula (3) is derived. Note that Vhl is not always equal to the threshold of the voltage (absolute value) applied to the resistance variable element 22 (both ends of the resistance variable element 22). That is, the absolute value of the voltage applied to the resistance variable element 22 may be sometimes smaller than Vhl even when the absolute value of the node potential is Vhl, because the absolute value of the node potential is a voltage including a sum of a voltage drop generated due to the wire resistance, the ON-resistance of the transistor or the like, and the voltage applied to the both ends of the resistance variable element 22, for attaining the low-resistance state.

$$\frac{V2 \times Rph - Vhl \times Rph}{Vhl + \frac{Vhl \times Rph}{Rrh}} \geq Rsh \quad (3)$$

For the reason similar to that mentioned above, some of the resistance variable elements 22 which operate at the higher speeds, are applied with a voltage having an absolute value of V2 from the write pulse drive circuit 50, even after the element has switched to the low-resistance state, because there is a variation in the resistance change characteristics of the elements. To prevent the resistance variable element 22 from returning to the high-resistance state or being broken, it is necessary to make the absolute value of the node potential less than Vlh quickly after the element has transitioned to the low-resistance state. When the condition which should be satisfied by the absolute value of the potential of the reference node and the resistance values is calculated under the above condition, the following formula (4) is derived:

$$\frac{V2 \times Rph - Vlh \times Rph}{Vlh + \frac{Vlh \times Rph}{Rrl}} < Rsh \quad (4)$$

If the formula (4) is satisfied, it is possible to prevent a rapid increase in the current flowing in the resistance variable element 22 (or rapid increase in the absolute value of the node potential relative to the resistance value of the resistance change current path), because a sufficient potential drop is generated in the series current path even when the resistance value of the resistance variable element 22 is reduced.

In the resistance variable memory apparatus 100 of this embodiment, Rsl, Rsh, Rpl, Rph, Rrl, Rrh, Vlh, Vhl, V1 and V2 are set to satisfy all of the above described conditions. In accordance with such a configuration, in writing of data to the resistance variable element using the electric pulses having the same polarity, it is possible to control the absolute value of the voltage applied to the resistance variable element after its resistance state has switched so that it falls within a proper range. That is, it is possible to design a circuit specifically using a voltage-dividing relationship calculated from the resistance values of the current paths. Therefore, it is possible to surely prevent re-switching (returning to its initial resistance state) after the resistance state switched or break of the resistance variable element.

In this embodiment, by using desired fixed resistance elements, by controlling the ON-resistances of the transistors used as the switches, or by adjusting the material or thickness of the resistance variable elements 22 or the wires, the resistance values of the current paths and the potentials can be easily controlled.

It should be noted that Vhl in the formula (2) and Vlh in the formula (4) are conditions for preventing the break of the resistance variable element 22 or re-switching of the resistance state, and need not necessarily coincide with Vhl and Vlh mentioned above. The voltages may have some allowance and may have smaller absolute values. For example, the circuit may be designed based on the following formula (5) derived from the formula (2) when Vhmax<Vhl:

$$\frac{V1 \times Rpl - Vhmax \times Rpl}{Vhmax + \frac{Vhmax \times Rpl}{Rrh}} < Rsl \quad (5)$$

The circuit may be designed based on the following formula (6) derived from the formula (4) when Vlmax<Vlh.

$$\frac{V2 \times Rph - Vl\max \times Rph}{Vl\max + \frac{Vl\max \times Rph}{Rrl}} < Rsh \quad (6)$$

In such a configuration, it is possible to reduce the absolute value of the potential applied to the resistance variable element after the resistance state has switched to a sufficiently small value, and therefore to more surely prevent the break of the resistance variable element or re-switching of the resistance state of the resistance variable element.

[Operation]

The operation of the resistance variable memory apparatus 100 will be described using illustrated specific numeric values. It is needless to say that the numeric values are exemplary and may be other values. It is assumed that the capacitive impedance is zero in this example for the simple explanation.

Consider a case where when Rrl is 5 k Ω and Rrh is 50 k Ω, the resistance value of the resistance change current path changes one digit. Suppose that Vlh is 2.0V and Vhl is 3.5V. In such a configuration, to switch the resistance variable element 22 in the low-resistance state to the high-resistance state, it is necessary to flow a current of (2.0[V]÷5[kΩ]=400 [μA]), while to switch the resistance variable element 22 in the high-resistance state to the low-resistance state, it is necessary to flow a current of (3.5[V]÷50[kΩ]=70[μA]).

Receiving an address of a memory cell 20 to which data is to be written and write data from an upstream system, the controller selects the specified memory cell 20 using the column decoder (not shown), the row decoder (not shown), etc. The selection transistor 21 of the selected memory cell 20 is placed in an electrically-conductive state. In addition, the controller controls the switches. When the write data is "0," the low-resistance series resistor selector switch 11 and the low-resistance parallel resistor selector switch 32 are turned ON, and the high-resistance series resistor selector switch 13 and the high-resistance parallel resistor selector switch 34 are turned OFF, to switch the resistance variable element 22 to the high-resistance state. On the other hand, when the write data is "1," the high-resistance series resistor selector switch 13 and the high-resistance parallel resistor selector switch 34 are turned ON, and the low-resistance series resistor selector switch 11 and the low-resistance parallel resistor selector switch 32 are turned OFF, to switch the resistance variable element 22 to the low-resistance state. When the control for the switches is complete, the controller controls the write pulse drive circuit 50 to cause the drive circuit 50 to output a write pulse between the first output terminal 51 and the second output terminal 52.

First, consider a case where the element 22 is switched from the low-resistance state to the high-resistance state. When the element 22 is switched to the high-resistance state, the absolute value of the voltage tends to be larger because the resistance value increases after the element has switched. In light of such a situation, the formula (5) is used to provide allowance. V1 is set to 5V, and Rpl is set to 2 k Ω as a practicable value in the semiconductor process. V1max is set to a value which is one volt smaller than Vlh. When the values are assigned to the formula (1) and the formula (5), the following condition is derived:

1923[Ω]<Rsl≦2143 [Ω]

For example, Rsl is set to 2100 [Ω] so that Vlh is close to 2.0V. In accordance with the above condition, when the write pulse drive circuit 50 applies to the first terminal 91 the electric pulse having an absolute value of 5V in the state where the resistance variable element 22 is in the low-resistance state, the absolute value of the node potential is 2.0V and the resistance variable element 22 switches to the high-resistance state. After the resistance variable element 22 has switched to the high-resistance state, the absolute value of the node potential is 2.4V which is sufficiently smaller than Vhl (3.5V). Therefore, re-switching to the low-resistance state will not occur.

Figure 2:
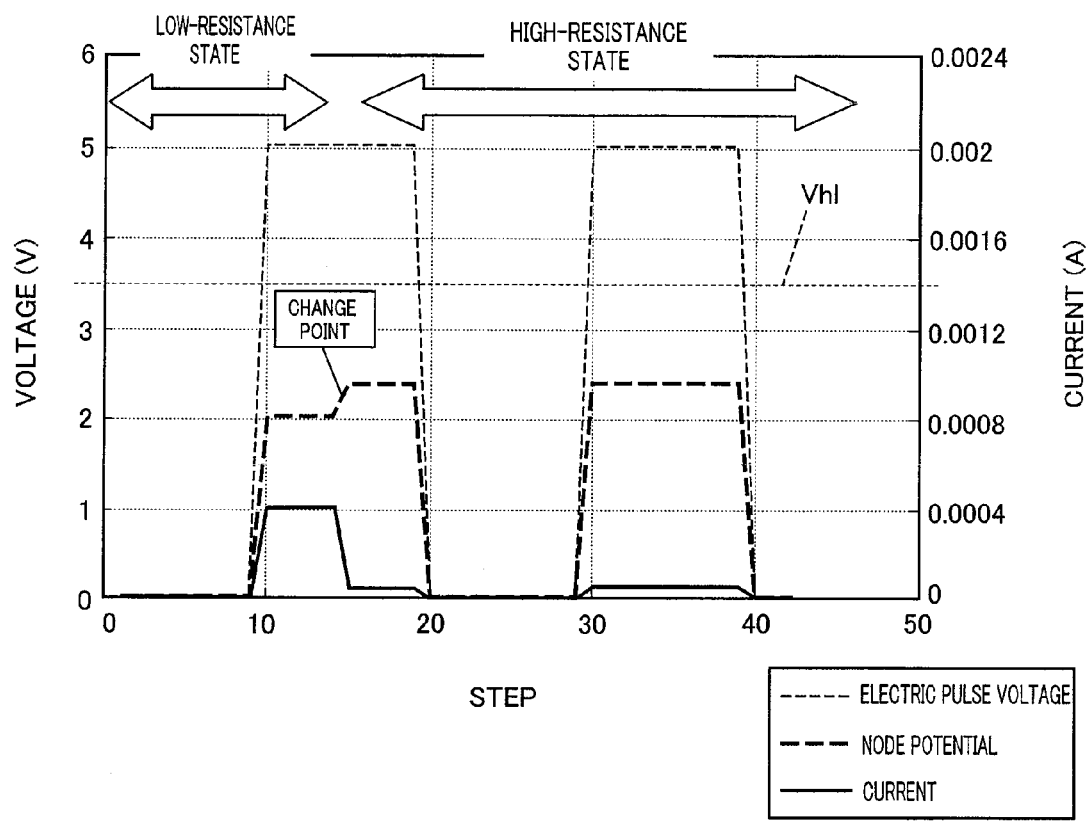
FIG. 2 is a graph schematically showing changes in an electric pulse voltage, a current flowing in a resistance variable element 22, and a node potential in a case where the resistance variable element 22 is switched from a low-resistance state to a high-resistance state.

FIG. 2 is a graph schematically showing changes in an electric pulse voltage, a current flowing in the resistance variable element 22, and a node potential in a case where the resistance variable element 22 is switched from the low-resistance state to the high-resistance state. A horizontal axis indicates time, but a time unit varies depending on a response speed of the resistance variable element 22. For this reason, the time is scaled and indicated by step number. For example, one step may be 100 ns or 10 μs. As shown in FIG. 2, when the write pulse drive circuit 50 applies thr electric pulse having an absolute value of 5V in the state where the resistance variable element 22 is in the low-resistance state, the resistance variable element 22 switches to the high-resistance state. After the resistance state has switched, the absolute value of the node potential does not increase up to a value which is above Vhl. Therefore, re-switching to the low-resistance state will not occur.

Subsequently, consider a case where the element 22 is switched from the high-resistance state to the low-resistance state. V2 is set to 5V, and Rph is set to, for example, 30 k Ω as a practicable value in the semiconductor process. When the values are assigned to the formula (3) and the formula (4), the following condition is derived:

6429[Ω]<Rsl≦8036 [Ω]

For example, Rsh is set to 8000 [Ω] so that Vhl is close to 3.5V. In accordance with the above condition, when the write pulse drive circuit 50 applies to the first terminal 91, the electric pulse having an absolute value of 5V in the state where the resistance variable element 22 is in the high-resistance state, the absolute value of the node potential is 3.5V and the resistance variable element 22 switches to the low-resistance state. After the resistance variable element 22 has switched to the low-resistance state, the absolute value of the node potential is 1.7V which is sufficiently smaller than Vlh (2.0V). Therefore, re-switching to the high-resistance state will not occur.

Figure 3:
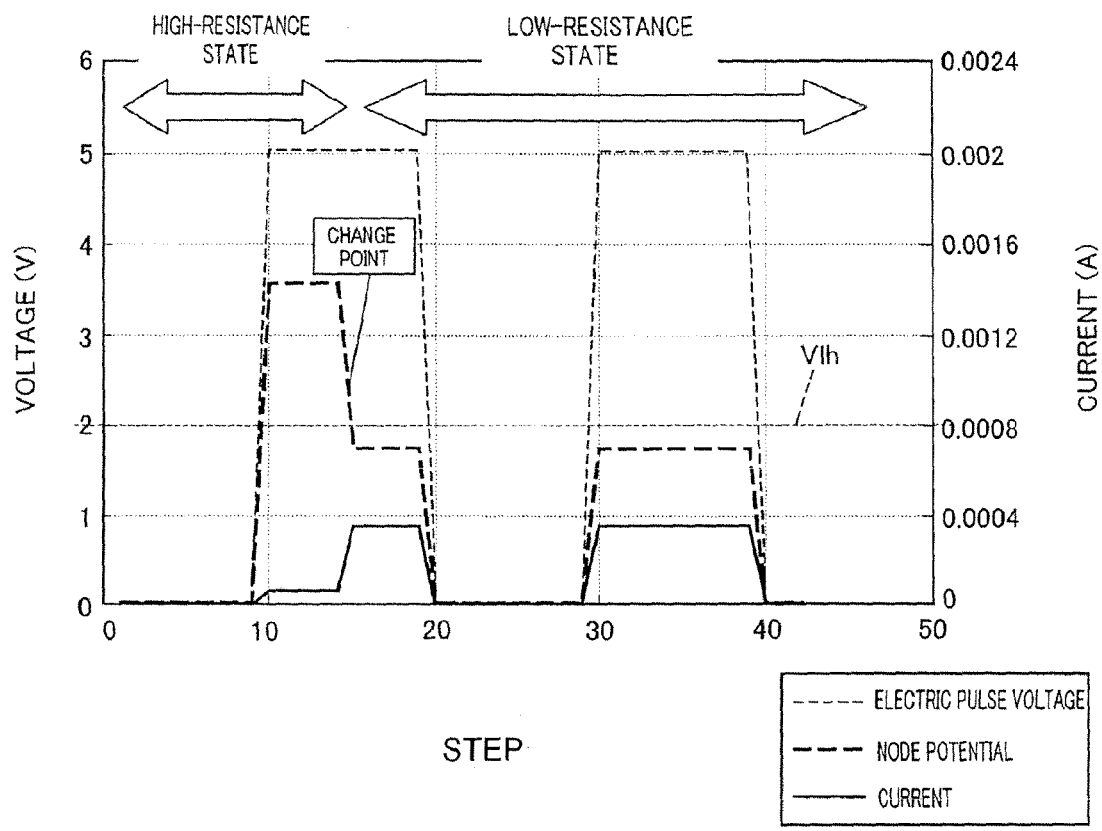
FIG. 3 is a graph schematically showing changes in an electric pulse voltage, a current flowing in the resistance variable element 22, and a node potential in a case where the resistance variable element 22 is switched from the high-resistance state to the low-resistance state.

FIG. 3 is a graph schematically showing changes in an electric pulse voltage, a current flowing in the resistance variable element 22, and a node potential in a case where the resistance variable element 22 is switched from the high-resistance state to the low-resistance state. A horizontal axis indicates the step number as in the case of FIG. 2. As shown in FIG. 3, when the write pulse drive circuit 50 applies the electric pulse having an absolute value of 5V in the state where the resistance variable element 22 is in the high-resistance state, the resistance variable element 22 switches to the low-resistance state. After the resistance state has switched, the absolute value of the node potential does not increase up to a value which is above Vlh. Therefore, re-switching to the high-resistance state does not occur.

Also, as shown in FIG. 2, even when the write pulse drive circuit 50 applies the electric pulse having an absolute value of 5V again after the element 22 has switched to the high-resistance state, the absolute value of the node potential does not increase up to a value which is above Vhl. Therefore, re-switching to the low-resistance state will not occur. Or, as shown in FIG. 3, even when the write pulse drive circuit 50 applies the electric pulse having an absolute value of 5V again after the element 22 has switched to the low-resistance state, the absolute value of the node potential does not increase up to a value which is above Vlh. Therefore, re-switching to the high-resistance state will not occur. This implies that the resistance variable memory apparatus 100 of this embodiment is capable of overwrite without special design. That is, in the conventional resistance variable memory apparatus, an operation is needed, in which stored data is read prior to writing, is compared to a value to be written, and no electric pulse is applied to a memory cell which is not desired to change the resistance state. In this embodiment, since reading in advance is not necessary, a processing speed is improved. Since it is not necessary to reset the element to the low-resistance state once (erase data all at once) in writing of data unlike the conventional configuration, the element is not subjected to an unnecessary stress. As a result, it is possible to provide a highly-reliable resistance variable memory apparatus.

[Advantage]

With the configuration and operation described above, the resistance variable memory apparatus 100 according to Embodiment 1 of the present invention can provide a resistance variable memory apparatus which does not require erasing data all at once when writing of data and has an improved processing speed. In addition, the resistance variable memory apparatus 100 is capable of surely preventing the incorrect operation or the break of the element during writing, with a simple configuration, in which the resistance variable element transitioning between plural resistance states in response to the electric pulses having the same polarity is used.

[Modification]

It should be noted that the above illustrated numeric values are merely exemplary and formulae or specific numeric values to be used may be selected or set as desired. The correspondence between the resistance states and the data (stored values) may be determined as desired. The high-resistance state may correspond to "1," and the low-resistance state may correspond to "0." Alternatively, three or more resistance states may be set to enable the memory to function as a multi-valued memory.

As the characteristic of the resistance variable element, the characteristic which allows writing to the low-resistance state and to the high-resistance state in response to the electric pulses of the same polarity will suffice. The electric pulses for use in actual writing may have different polarities between switching to the low-resistance state and switching to the high-resistance state.

V1 and V2 are not necessarily equal values but may be different values. Nonetheless, it is desired that V1 and V2 be equal to simplify the apparatus configuration or operation control.

In some cases, the wire resistance is non-negligible and a difference in wire resistance between positions in the memory cell array is non-negligible as well. In those cases, resistors with different resistance values may be prepared, and a series resistor switch and a parallel resistor switch may be configured to select proper resistors according to the selected memory cell so that resistance values of the current paths become desired values.

The series resistor switch and the parallel resistor switch need not be configured to select either one of the two resistance values. Any other configuration of the series resistor switch and the parallel resistor switch may be used so long as the series resistor switch and the parallel resistor switch can set the resistance values of the series current path and the parallel current path to desired values according to the value of data to be written. For example, the series resistor switch and the parallel resistor switch may be configured to select the resistance values from among a number of resistance values or otherwise to continuously change the resistance values.

Embodiment 2

[Configuration]

In Embodiment 1, the series current path and the parallel current path are each comprised of a fixed resistance element and a switch which are generally used, and the write pulse drive circuit 50 applies pulses. In contrast, in Embodiment 2, the resistors and switches of the series current path and the parallel current path are implemented by ON-resistance and switching functions of the transistors, and the electric pulse is generated and input by ON/OFF operation of the transistor.

Figure 4:
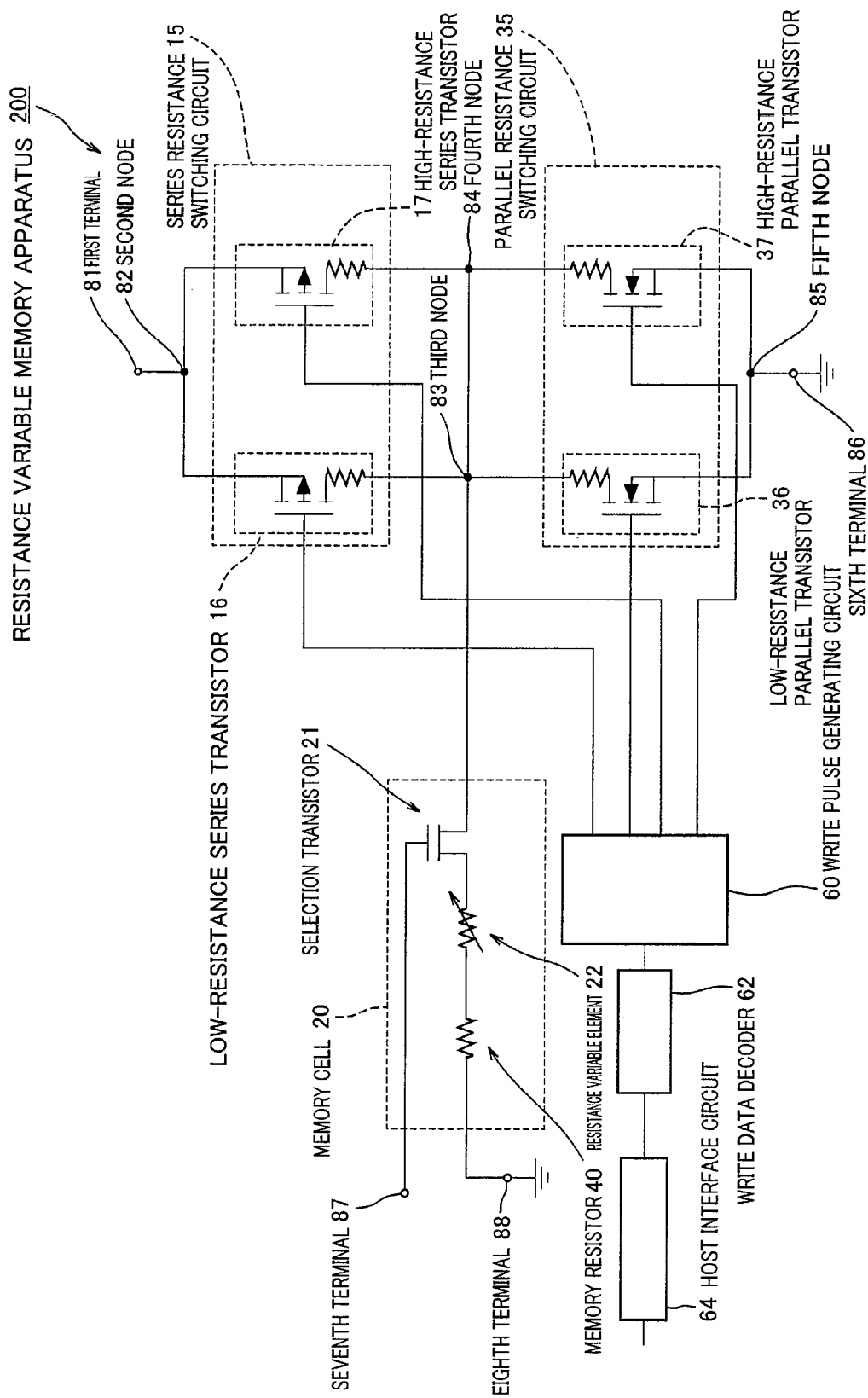
FIG. 4 is a wiring diagram showing an example of a resistance variable memory apparatus according to Embodiment 2 of the present invention.

FIG. 4 is a wiring diagram showing an example of a resistance variable memory apparatus according to Embodiment 2 of the present invention. Hereinafter, the resistance variable memory apparatus 200 of this embodiment will be described with reference to FIG. 4.

As shown in FIG. 4, the resistance variable memory apparatus 200 comprises a series resistance switching circuit 15 (series resistance setting unit), the memory cell 20, a parallel resistance switching circuit 35 (parallel resistance setting unit), a write pulse generating circuit 60 (electric pulse application device), a write data decoder 62, and a host interface circuit 64.

The series resistance switching circuit 15 includes a low-resistance series transistor 16 and a high-resistance series transistor 17. A low-resistance circuit including the low-resistance series transistor 16 is connected to the second node 82 and to the third node 83. In parallel with this circuit, a high-resistance circuit including the high-resistance series transistor 17 is connected to the second node 82 and to the fourth node 84. The second node 82 is connected to the first terminal 81. The third node 83 and the fourth node 84 are interconnected. The low-resistance series transistor 16 and the high-resistance series transistor 17 are connected to the write pulse generating circuit 60 so that they are turned ON/OFF selectively by the write pulse generating circuit 60. When the low-resistance series transistor 16 is in an ON-state, the high-resistance series transistor 17 is placed in an OFF-state. When the high-resistance series transistor 17 is in an ON-state, the low-resistance series transistor 16 is placed in an OFF-state. As the low-resistance series transistor 16 and the high-resistance series transistor 17, p-type MOS-FETs are used. The second node 82 is merely illustrated as the node. Two circuits (high-resistance circuit and low-resistance circuit) may directly branch from the first terminal 82. The third node 83 and the fourth node 83 may be one node.

The memory cell 20 is identical to the memory cell 20 in Embodiment 1, and will not be described in detail. In this embodiment, one main terminal of the selection transistor 21 is connected to the third node 83 and to the fourth node 84. The seventh terminal 87 is identical to the sixth terminal 96 of Embodiment 1, and the eighth terminal 88 is identical to the ninth terminal 99 of Embodiment 1.

The parallel resistance switching circuit 35 includes a low-resistance parallel transistor 36 and a high-resistance parallel transistor 37. A low-resistance circuit including the low-resistance parallel transistor 36 is connected to the third node 83 and to the fifth node 85. In parallel with this circuit, a high-resistance circuit including the high-resistance parallel transistor 37 is connected to the fourth node 84 and to the fifth node 85. The fifth node 85 is connected to the sixth terminal 86. The sixth terminal 86 is electrically grounded. The low-resistance parallel transistor 36 and the high-resistance parallel transistor 37 are connected to the write pulse generating circuit 60 so that they are turned ON/OFF selectively by the write pulse generating circuit 60. When the low-resistance parallel transistor 36 is in an ON-state, the high-resistance parallel transistor 37 is placed in an OFF-state. When the high-resistance parallel transistor 37 is in an ON-state, the low-resistance parallel transistor 36 is placed in an OFF-state. As the low-resistance parallel transistor 36 and the high-resistance parallel transistor 37, n-type MOS-FETs are used. The fifth node 85 is merely illustrated as the node. Two circuits (low-resistance circuit and high-resistance circuit) may directly branch from the sixth terminal 86.

The first terminal 81 is connected to the electric power supply (not shown) and is applied with a predetermined voltage (e.g., +5V). The electric power supply has two terminals. One of the terminals is connected to the first terminal 81 and the other is electrically grounded. That is, the other terminal of the electric power supply is connected to the sixth terminal 86 and to the eighth terminal 88. The applied voltage of the electric power supply may be changed suitably.

The write pulse generating circuit 60 is connected to a gate of the low-resistance series transistor 16, a gate of the high-resistance series transistor 17, a gate of the low-resistance parallel transistor 36, and a gate of the high-resistance parallel transistor 37. The write pulse generating circuit 60 is a control circuit configured to control a voltage applied to the gate of each transistor to control ON/OFF of the transistor based on write data input.

The write data decoder 62 is a decoder for decoding the address of the memory cell 20 to which data is to be written and the write data, based on a signal input. The address is input to the row decoder (not shown) and to the column decoder (not shown). The write data is input to the write pulse generating circuit 60.

The host interface circuit 64 is an interface for inputting a signal to the write data decoder 62 based on input/output data and a control command which are input from an external system via an external interface (not shown).

Hereinafter, the relationship between the resistance values of the current paths and the voltages which is a feature of the resistance variable memory apparatus 200 will be described. For the sake of simple explanation, it is assumed that the resistance between the third node 83 and the fourth node 84 is negligible and both nodes are at equipotential. In this embodiment, the third node 83 and the fourth node 84 serve as references nodes.

The current path connecting the first terminal 81 to the third node 83 (reference node) or the fourth node 84 (reference node) has a series positional relationship with the memory cell 20, supposing that the current path from the first terminal 81 to the eighth terminal 88 is one current path. Accordingly, this current path is referred to as a series current path. The resistance value of the series current path (current path connecting 81, 82, 16, and 83 in turn in FIG. 4) passing through the low-resistance series transistor 16 with the low-resistance series transistor 16 being in an ON-state is expressed as Rsl. The resistance value of the series current path (current path connecting 81, 82, 17, and 84 in turn in FIG. 4) passing through the high-resistance series transistor 17 with the high-resistance series transistor 17 being in an ON-state is expressed as Rsh. Rsl includes the wire resistance or the like in addition to the ON-resistance of the low-resistance series transistor 16. Likewise, Rsh includes the wire resistance or the like, in addition to the ON-resistance of the high-resistance series transistor 17. Rsl and Rsh can be easily set to desired values by controlling the gate width and gate length of each transistor or dimension and material of the wires, etc.

The current path (current path connecting 84, 83, 21, 22, 40, and 88 in turn in FIG. 4) connecting the third node 83 (reference node) or the fourth node 84 (reference node) to the eighth terminal 88 with the selection transistor 21 being in an ON-state is referred to as a resistance change current path. The resistance value of the resistance variable element 22 in the low-resistance state is expressed as Rrl and the resistance value of the resistance variable element 22 in the high-resistance state is expressed as Rrh. Rrl and Rrh each includes the wire resistance, the ON-resistance of the selection transistor 21, the resistance of the memory resistor 40, and the like, in addition to the resistance value of the resistance variable element 22.

The current path connecting the third node 83 (reference node) or the fourth node 84 (reference node) to the ground point (sixth terminal 96) has a parallel positional relationship with the memory cell 20, supposing that the current path from the first terminal 81 to the ground point is one current path. Accordingly, this current path is referred to as a parallel current path. The resistance value of the parallel current path (current path connecting 83, 36, 85, and 86 in turn in FIG. 4) passing through the low-resistance parallel transistor 36 with the low-resistance parallel transistor 36 being in an ON-state is expressed as Rpl. The resistance value of the current path (current path connecting 84, 37, 85, and 86 in turn in FIG. 4) passing through the high-resistance parallel transistor 37 with the high-resistance parallel transistor 37 being in an ON-state is expressed as Rph. Rpl includes the wire resistance or the like in addition to the ON-resistance of the low-resistance parallel transistor 36. Rph includes the wire resistance or the like, in addition to the ON-resistance of the high-resistance parallel transistor 37. Rpl and Rph can be easily set to desired values by controlling the gate width and gate length of each transistor, dimension and material of the wires, etc.

Since one terminal of the electric power supply, the sixth terminal 86, and the eighth terminal 88 are electrically grounded, they may be assumed to be connected to each other. To be specific, it may be considered that the resistance change current path is a current path connecting the reference node to the electric power supply via the resistance variable element 22, and the parallel current path is a current path connecting the reference node to electric power supply in parallel with the resistance change current path.

The resistance variable element 22 has a current-voltage characteristic which is similar to that shown in FIG. 12, although its specific current values and voltages may be different. The potential of the third node 83 (reference node) and the potential of the fourth node 94 (reference node) are hereinafter referred to as the node potential. The absolute value of the node potential which is required to switch the resistance variable element 22 from the low-resistance state to the high-resistance state is expressed as Vlh (first voltage level). The absolute value of the node potential which is required to switch the resistance variable element 22 from the high-resistance state to the low-resistance state is expressed as Vhl (second voltage level). The two node potentials have the same polarity (signs are same). In this embodiment, the second voltage level is larger than the first voltage level (Vhl>Vlh).

In the above configuration, the resistance values of the current paths and the voltages are set to satisfy the formula (1) to the formula (4) as described in Embodiment 1. In accordance with such a configuration, in writing of data to the resistance variable element using the electric pulses having the same polarity, the absolute value of the voltage applied to the resistance variable element after the resistance state has switched can be controlled to fall within a proper range. Therefore, it is possible to prevent re-switching (returning to its initial resistance state) after the resistance state has switched or break of the resistance variable element.

Alternatively, the resistance values of the current paths and the voltages may be set to satisfy the formula (5) or the formula (6). In such a configuration, the absolute value of the potential applied to the resistance variable element 22 after the resistance state has switched can be reduced to a smaller value. Therefore, it is possible to surely prevent break of the resistance variable element or re-switching of the resistance state of the resistance variable element.

[Operation]

Hereinafter, the operation of the resistance variable memory apparatus 200 will be described.

An external system inputs input/output data and a control command to the host interface circuit 64 via an external communication path. Based on the data and the command received, the host interface circuit 64 inputs a signal to the write data decoder 62.

The write data decoder 62 decodes the received signal to specify an address of the memory cell 20 to which data is to be written and write data. The write data decoder 62 controls the column decoder (not shown) and the row decoder (not shown) based on the specified address to select the specified memory cell 20. At this time, the selection transistor 21 of the memory cell 20 is placed in an electrically-conductive state.

The write data decoder 62 inputs the decoded write data to the write pulse generating circuit 60. The write pulse generating circuit 60 causes the low-resistance series transistor 16 and the high-resistance series transistor 17 to be in an ON-state for a specified time to apply a predetermined electric pulse to the memory cell 20 and to the parallel resistance switching circuit 35. In addition, the write pulse generating circuit 60 controls the ON/OFF of the respective transistors to switch the resistance of the series resistance switching circuit 15 and the resistance of the parallel resistance switching circuit 35.

To be specific, the write pulse generating circuit 60 operates as follows. When the write data is "0," the resistance variable element 22 is switched to the high-resistance state. The write pulse generating circuit 60 applies to the gate of the low-resistance series transistor 16 a high-resistance state attaining pulse for the series transistor 16 which allows application of a predetermined voltage amplitude between the second node 82 and the gate so that the series transistor 16 is well in an electrically-conductive state for a specified time width. Meanwhile, the write pulse generating circuit 60 applies to the low-resistance parallel transistor 36 a high-resistance state attaining pulse for the parallel transistor 36 which allows application of a predetermined voltage amplitude between the fifth node 85 and the gate so that the parallel transistor 36 is well in an electrically-conductive state for a specified time width. At the same time, the write pulse generating circuit 60 applies to the gate of high-resistance series transistor 17 and to the gate of the high-resistance parallel transistor 37, the potential for allowing the high-resistance series transistor 17 and the high-resistance parallel transistor 37 to be turned to electrically-non-conductive state. With such an operation, the voltage (absolute value is V1) supplied from the electric power supply is applied between the first terminal 81 and the eighth terminal 88 and between the first terminal 81 and the sixth terminal 86 for the specified time width. Therefore, as described in Embodiment 1, the resistance variable element 22 is switched from the low-resistance state to the high-resistance state. The resistance variable element 22 in the high-resistance state keeps the high-resistance state.

When the write data is "1," the resistance variable element 22 is switched to the low-resistance state. The write pulse generating circuit 60 applies to the gate of the high-resistance series transistor 17 a low-resistance state attaining pulse for the series transistor 17 which allows application of a predetermined voltage amplitude between the second node 82 and the gate so that the series transistor 17 is well in an electrically-conductive state for a specified time width. Meanwhile, the write pulse generating circuit 60 applies to the high-resistance parallel transistor 37 a low-resistance state attaining pulse for the parallel transistor 37 which allows application of a predetermined voltage amplitude between the fifth node 85 and the gate so that the parallel transistor 37 is well in an electrically-conductive state for a specified time width. Simultaneously, the write pulse generating circuit 60 applies to the gate of the low-resistance series transistor 16 and the gate of the low-resistance parallel transistor 36, the potential for allowing the low-resistance series transistor 16 and the low-resistance parallel transistor 36 to be turned to electrically-non-conductive state. With such an operation, the voltage (absolute value is V2) supplied from the electric power supply is applied between the first terminal 81 and the eighth terminal 88 and between the first terminal 81 and the sixth terminal 86 for the specified time width. Therefore, as described in Embodiment 1, the resistance variable element 22 is switched from the high-resistance state to the low-resistance state. The resistance variable element 22 in the low-resistance state keeps the low-resistance state.

The change patterns of the voltages or currents during the operation of Embodiment 2 are identical to those of Embodiment 1, and will not be further described. Specific numeric values of the resistance values and voltages of Embodiment 2 may be identical to those of Embodiment 1, and will not be described.

[Advantage]

With the above described configuration and operation, the resistance variable memory apparatus 200 according to Embodiment 2 of the present invention achieves the advantages similar to those achieved by Embodiment 1.

In addition, in this embodiment, the resistance values of the series current path and the parallel current path can be easily set to desired values by controlling the gate widths and gate lengths of the transistors. Therefore, the resistance variable memory apparatus 200 has an advantage that the resistance values of the current paths can be easily controlled by using an integration technique using a semiconductor process.

[Modification]

In this embodiment, modification similar to that of Embodiment 1 may be practicable.

Embodiment 3

The resistance variable memory apparatuses of Embodiment 1 and Embodiment 2 are configured not to include a controller and to cause the series resistance switching circuit to switch the resistance value of the series current path and the parallel resistance switching circuit to switch the resistance value of the parallel current path, based on the signals input from an external controller. In contrast, the resistance variable memory apparatus of Embodiment 3 is different from those of Embodiment 1 and Embodiment 2 in that the memory apparatus of Embodiment 3 includes a controller which is configured to switch the resistance values of the series current path and the parallel current path, based on the input signals externally input.

[Configuration]

Figure 5:
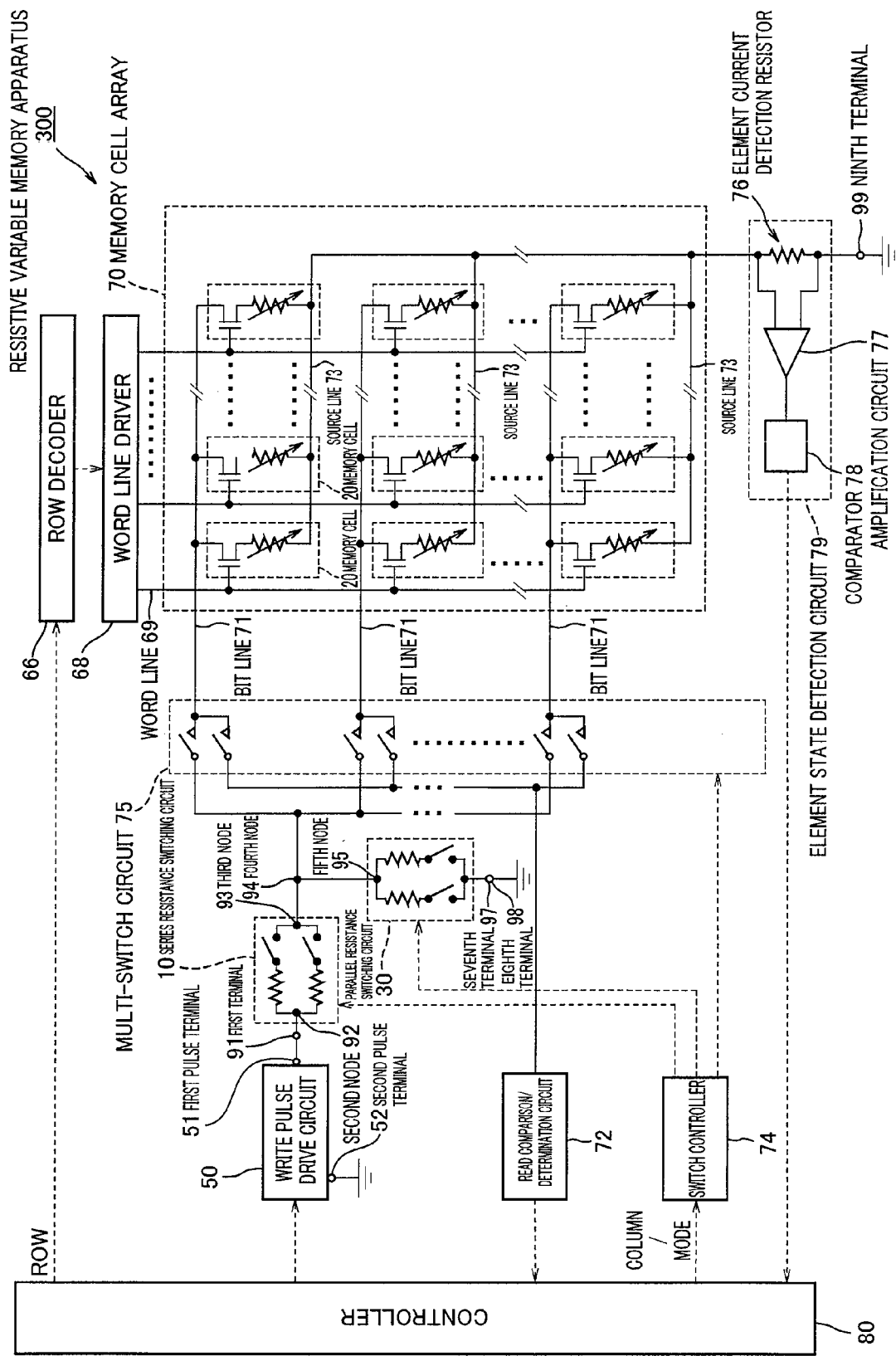
FIG. 5 is a wiring diagram showing an example of a resistance variable memory apparatus according to Embodiment 3 of the present invention.

FIG. 5 is a wiring diagram showing an example of the resistance variable memory apparatus according to Embodiment 3 of the present invention. With reference to FIG. 5, the resistance variable memory apparatus 300 of this embodiment will be described. The components and constituents which are the same as those of Embodiment 1 (FIG. 1) and Embodiment 3 (FIG. 5) are identified by the same reference numbers and names and will not be further described.

As shown in FIG. 5, the resistance variable memory apparatus 300 comprises as major constituents, a memory cell array 70, a row decoder 66, a word line driver 68, a multi-switch circuit 75, a series resistance switching circuit 10, a parallel resistance switching circuit 30, a write pulse drive circuit 50, a read comparison/determination circuit 72, a switch controller 74, an element state detection circuit 79, and a controller 80.

The memory cell array 70 includes a plurality of memory cells 20. In the memory cell array 70, the memory cells 20 are arranged in matrix form. The gates of the selection transistors 21 included in the memory cells 20 belonging to each row are connected to a word line 69 provided on each row. One main terminals of the selection transistors 21 of the memory cells 20 belonging to each column are connected to a bit line 71 provided on each column. The other main terminals of the selection transistors 21 of the memory cells 20 belonging to each row are connected to a source line 73 provided on each column via the resistance variable elements 22.

The word lines 69 are respectively connected to the word line driver 68. The word line driver 68 is communicatively connected to the row decoder 66 and applies an ON-voltage to a specified word line 69 based on the control of the row decoder 66. The row decoder 66 is communicatively connected to the controller 80. The row decoder 66 controls the word line driver 68 based on ROW signal received from the controller 80.

The bit lines 71 are respectively connected to the multi-switch circuit 75. The multi-switch circuit 75 is communicatively connected to the switch controller 74. (column decoder). The multi-switch circuit 75 includes plural switches (e.g., FETs) and selectively connects a specified bit line 71 to the fourth node 94 (reference node) or to the read comparison/determination circuit 72 in accordance with the control of the switch controller 74. The read comparison/determination circuit 72 is communicatively connected to the controller 80.

The fourth node 94 is connected to the write pulse drive circuit 50 via the series resistance switching circuit 10 and is electrically grounded (seventh terminal 97, eighth terminal 98) via the parallel resistance switching circuit 30. The write pulse drive circuit 50 is communicatively connected to the controller 80.

The switch controller 74 is communicatively connected to the series resistance switching circuit 10, the parallel resistance switching circuit 30, the multi-switch circuit 75, and the controller 80. The switch controller 74 controls ON/OFF of the switches of the series resistance switching circuit 10, the parallel resistance switching circuit 30, and the multi-switch circuit 75, based on the signal received from the controller 80.

The resistance values (resistance value associated with the low-resistance state and the resistance value associated with the high-resistance state) of the resistance variable elements 22 included in the memory cells 20, the resistance values of the resistors included in the series resistance switching circuit 10 and the parallel resistance switching circuit 30, the voltage of the electric pulse applied from the write pulse drive circuit 50, the voltage of the fourth node 94, and others are identical to those in Embodiment 1, and will not be further described.

[Operation]

Hereinafter, the operation of the resistance variable memory apparatus 300 will be described with reference to FIG. 5.

The controller 80 is constituted by, for example, a microcomputer. The controller 80 receives a control command, an address, and write data via an external communication path (not shown) from an external system (not shown) and outputs the data read from the memory cell to the external system.

The controller 80 extracts row data from the received address and sends ROW signal to the row decoder 66 based on the obtained data. The row decoder 66 decodes the received ROW signal and outputs a row address to the word line driver 68. The word line driver 68 applies an ON-voltage to a specified word line 69 based on the received row address. All the selection transistors 21 connected to the word line which has been applied with the ON-voltage are turned to an electrically-conductive state and the memory cells 20 existing on the associated row are rendered accessible.

The controller 80 extracts column data from the received address and sends COLUMN signal based on obtained data and a signal (MODE) indicating whether or not the control command is "write" or "read," to the switch controller 74.

When the MODE signal indicates "write," the switch controller 74 controls the switches of the series resistance switching circuit 10 and the parallel resistance switching circuit 30 based on the value of the received write data. To be specific, when the write data is "0," the low-resistance series resistor selector switch 11 and the low-resistance parallel resistor selector switch 32 are turned ON and the high-resistance series resistor selector switch 13 and the high-resistance parallel resistor selector switch 34 are turned OFF to switch the resistance variable element 22 to the high-resistance state. On the other hand, when the write data is "1," the high-resistance series resistor selector switch 13 and the high-resistance parallel resistor selector switch 34 are turned ON, and the low-resistance series resistor selector switch 11 and the low-resistance parallel resistor selector switch 32 are turned OFF to switch the resistance variable element 22 to the low-resistance state.

The switch controller 74 decodes the received COLUMN signal to obtain the column address. The switch controller 74 controls the multi-switch circuit 75 based on the obtained column address to connect a specified bit line 71 to the fourth node 94 or to the comparison/determination circuit 72. To be specific, when the MODE signal indicates "write," the specified bit line 71 is connected to the write pulse drive circuit 50 via the series resistance switching circuit 10, or electrically grounded via the parallel resistance switching circuit 30. On the other hand, when the MODE signal indicates "read," the specified bit line 71 is connected to the comparison/determination circuit 72.

In the manner described above, in this embodiment, the word line 69 and the bit line 71 are selected to select the specified memory cell 20.

When control for the switches and selection of the memory cell are complete, data is written or read. When writing data, the controller 80 controls the write pulse drive circuit 50 to cause the write pulse drive circuit 50 to output the write pulse between the first output terminal 51 and the second output terminal 2. With this operation, data is written to a desired memory cell 20. The relationship between the resistance values and the voltages and a principle of the write operation are similar to those of Embodiment 1, and will not be further described.

When reading data, the controller 80 controls the comparison/determination circuit 72 to apply a predetermined read electric pulse to the selected memory cell 20, and detects and determines a current flowing at that point of time. As the detection circuit, a generally known technique may be used and a detailed description thereof is omitted. As a typical example, a detection circuit such as a current mirror may be used for detection. And, a determination result (read data) is output to the external system via the controller 80.

[Advantage]

With the above described configuration and operation, the resistance variable memory apparatus 300 according to Embodiment 3 of the present invention achieves the advantages similar to those achieved by Embodiment 1.

In addition, since the resistance variable memory apparatus 300 includes the controller, the external system has only to input an operation command, an address, and write data to enable writing and reading of the data. Therefore, the resistance variable memory apparatus 300 is flexibly adapted to external systems having various interfaces or communication protocols.

[Modification]

In this embodiment, modification similar to that of Embodiment 1 may be practicable.

Embodiment 4

The memory apparatuses of Embodiment 1 to Embodiment 3 are memory apparatuses configured to perform writing plural times. In contrast, a resistance variable memory apparatus of Embodiment 4 is a memory apparatus (write once memory) which performs writing once. In Embodiment 4, switching only from the high-resistance state to the low-resistance state occurs, and the parallel current path is omitted.

[Configuration]

Figure 6:
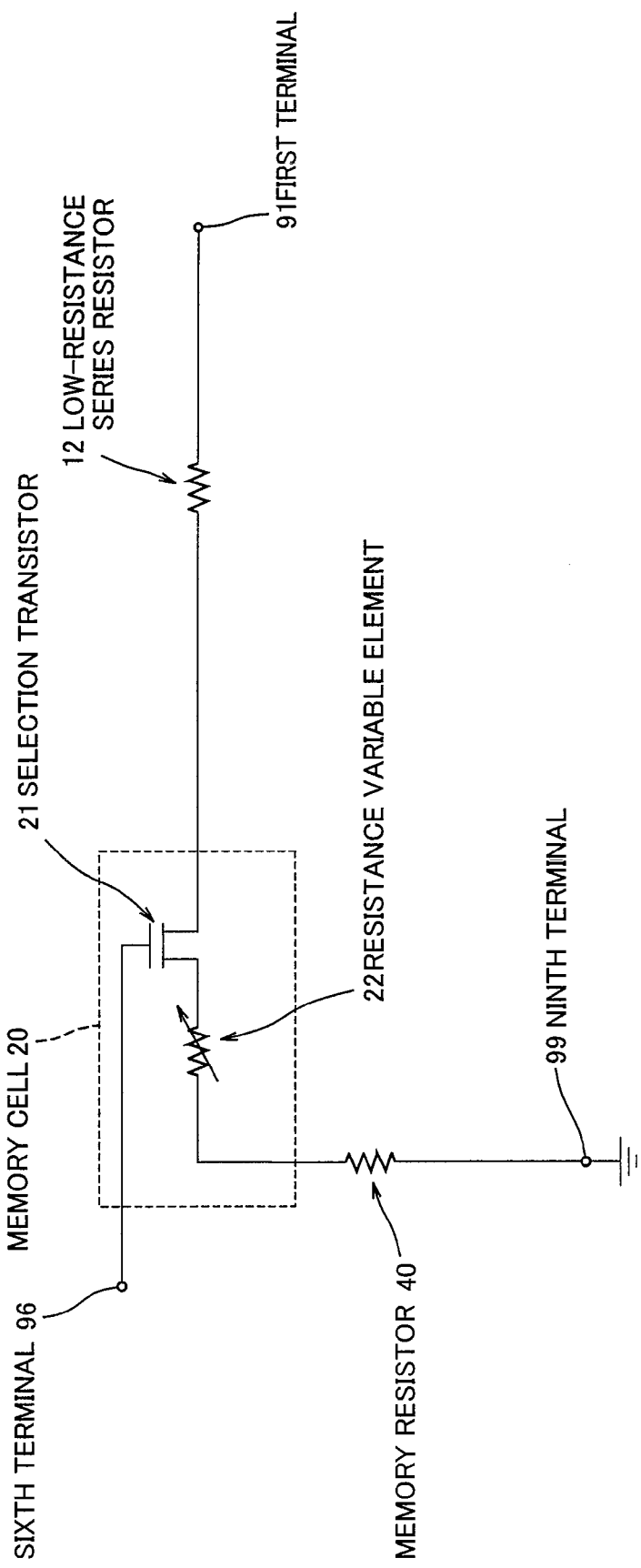
FIG. 6 is a wiring diagram showing an example of a resistance variable memory apparatus according to Embodiment 4 of the present invention.

FIG. 6 is a wiring diagram showing an example of the resistance variable memory apparatus according to Embodiment 4 of the present invention. With reference to FIG. 6, the resistance variable memory apparatus 400 of this embodiment will be described.

In the resistance variable memory apparatus 400, the memory cells are set to the high-resistance state in shipping. The resistance value (high-resistance state) in shipping is allocated to "0," and only the resistance value of the memory cell applied with the electric pulse switches to the resistance value (low-resistance state) corresponding to "1." Since switching only from the high-resistance state to the low-resistance state occurs, the low-resistance series current path and the parallel current path in Embodiment 1 are not necessary.

Since there is no parallel current path in this embodiment, there is no reference node. In this embodiment, the potential of one main terminal (main terminal of the selection transistor 21 which is not connected to the resistance variable element 22) is the bit line potential, and the resistance value and the potential are set based on the bit line potential. Note that the bit line potential may be defined at a desired point on the wire (bit line) connecting the first terminal 91 to the selection transistor 21.

The resistance variable element 22 has a current-voltage characteristic which is similar to that shown in FIG. 12, although its specific current values and voltages may be different. The absolute value of the bit line potential which is required to switch the resistance variable element 22 from the high-resistance state to the low-resistance state is expressed as Vhl' (third voltage level). The absolute value of the bit line potential which is required to switch the resistance variable element 22 from the low-resistance state to the high-resistance state is expressed as Vlh' (fourth voltage level). The two bit line potentials have the same polarity (signs are same). In this embodiment, the third voltage level is larger than the fourth voltage level (Vhl'>Vlh').

The resistance value of the current path (series current path) connecting the first terminal 91 to the reference point (herein one main terminal of the selection transistor 21) of the bit line potential is expressed as Rs. Rs includes the wire resistance and the like in addition to the resistance of the low-resistance series resistor 12. A resistor element may be provided as the low-resistance series resistor 12. Alternatively, merely based on the wire resistance, the resistance value of the series current path may be controlled to have a desired value.

The resistance value of the current path (resistance change current path) connecting the reference point of the bit line potential to the ninth terminal 99 with the selection transistor 21 being in an ON-state in the state where the resistance variable element 22 is in the low-resistance state is expressed as Rrl,' and the resistance value thereof in the state where the resistance variable element 22 is in the high-resistance state is expressed as Rrh.' The Rrl' and Rrh' each includes the wire resistance, the ON-resistance of the selection transistor 21, the resistance of the memory resistor 40, and the like, in addition to the resistance of the resistance variable element 22.

When the absolute value of the voltage of the electric pulse (third electric pulse) applied from the write pulse drive circuit 50 to switch the resistance variable element 22 from the high-resistance state to the low-resistance state is expressed as V3, it is required that the absolute value of the bit line potential be Vhl' or larger. When the potential drop and others of the current paths are calculated under such a condition, the following formula (7) is derived. Note that Vhl' is not always equal to the threshold of the voltage (absolute value) applied to the resistance variable element 22. The absolute value of the voltage applied to the resistance variable element 22 is smaller than Vhl' even when the absolute value of the bit line potential is Vhl,' because the absolute value of the node potential is a voltage including a sum of a voltage drop generated due to the wire resistance, the ON-resistance of the transistor or the like, and the voltage applied to the both ends of the resistance variable element 22 for attaining the low-resistance state.

$$\frac{(V3 - Vhl') \times Rrh'}{Vhl'} \geq Rs \qquad (7)$$

The plurality of resistance variable elements 22 are arranged on the memory cell array, and therefore, there is a variation in their resistance change characteristics. In the case where an electric pulse having a specified width is applied to these elements, some of them, which operate at higher speeds, switch the resistances well with a front-half part of the width. In this case, even after the element has switched to the low-resistance state, it is applied with a voltage having an absolute value of V3 from the write pulse drive circuit 50. To prevent the resistance variable element 22 from returning to the high-resistance state or being broken, it is required that the absolute value of the node potential be less than Vlh' quickly after the element has transitioned to the high-resistance state. When the potential drops or the like on the current paths are calculated under the condition, the following formula (8) is derived:

$$\frac{(V3 - Vlh') \times Rrl'}{Vlh'} < Rs \quad (8)$$

In this embodiment, it is possible to specifically design a circuit using the voltage-dividing relationship calculated from the resistance values of the current paths. In such a configuration, it is possible to surely switch the resistance variable element 22 to the low-resistance state as desired. Furthermore, after the resistance variable element 22 has switched to the low-resistance state, re-switching to the high-resistance state will not occur.

[Operation]

The operation of the resistance variable memory apparatus 500 will be described by showing specific numeric values. Consider a case where when Rrl is 5 kΩ and Rrh is 50 kΩ, the resistance value of the resistance change current path changes one digit. Suppose that Vlh' is 2.0V, Vhl' is 3.5V and V3 is 5V. When these values are assigned to the formula (7) and formula (8), the following condition is derived:

7500 [Ω]<Rs≦21400[Ω]

As in Embodiment 1, suppose that Rs is 8000Ω. In writing of data, the write pulse drive circuit 50 applies a third electric pulse to the first terminal 91 only when data is written to the memory cell 20 to which a value of "1" is to be written. When the resistance variable element 22 is in the high-resistance state, the absolute value of the bit line potential is 4.3V which is significantly larger than Vhl.' Therefore, the resistance variable element 22 switches to the low-resistance state and the data "1" is written to the element 22. On the other hand, after the resistance variable element 22 has switched to the low-resistance state, the absolute value of the bit line potential is 1.9V which is below Vlh' even though the write pulse drive circuit 50 applies to the first terminal 91 an electric pulse having an absolute value of 5V. Therefore, the resistance variable element 22 which has switched to the low-resistance state once will not return to the high-resistance state. When data is written to the memory 20 to which value of "0" is to be written, the write pulse drive circuit 50 writes data to a subsequent memory cell 20 without generating the electric pulse. With the above described operation, data is written to the resistance variable memory apparatus 500 in a "write once" manner.

When the value to be written to the memory cell 20 is "0" in this embodiment, no electric pulse is applied and the resistance state of the resistance variable element 22 belonging to the memory cell 20 will not change. In this embodiment, it is assumed that even in such a case, "writing" has occurred.

[Advantage]

In this embodiment, the "write once" manner is used, and the element is caused to switch only from the high-resistance state which is an initial state to the low-resistance state, making it possible to omit the parallel current path. Therefore, the configuration can be made very simple. The resistance variable memory apparatus of this embodiment is capable of preventing the incorrect operation or break of the element when writing data with a very simple configuration using the resistance variable element transitioning between plural resistance states in response to the electric pulses of the same polarity.

[Modification]

The correspondence between the resistance state and data (value to be stored) is determined as descried. The high-resistance state may correspond to "1," and the low-resistance state may correspond to "0." The parallel current path may be omitted by causing the element to switch only from the low-resistance state which is an initial state to the high-resistance state.

Embodiment 5

The parallel current path is omitted in Embodiment 4, whereas a resistance variable memory apparatus of Embodiment 5 is a write once memory including the parallel current path.

[Configuration]

Figure 7:
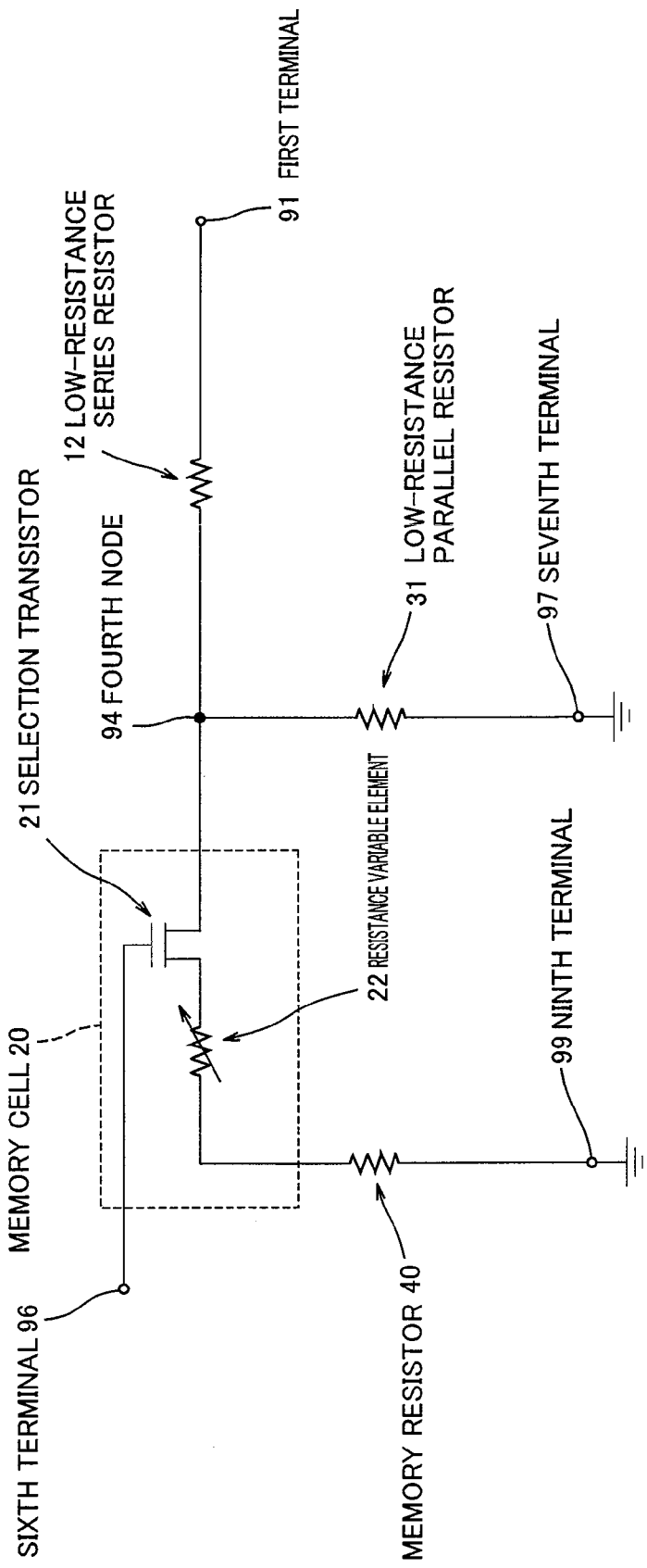
FIG. 7 is a wiring diagram showing an example of a resistance variable memory apparatus according to Embodiment 5 of the present invention.

FIG. 7 is a wiring diagram showing an example of the resistance variable memory apparatus according to Embodiment 5 of the present invention. With reference to FIG. 7, a resistance variable memory apparatus 500 of this embodiment will be described.

In the resistance variable memory apparatus 500, the memory cells are set to the low-resistance state in shipping. The resistance value (low-resistance state) in shipping is allocated to "1" and the resistance value of the high-resistance state is allocated to "0." Only when the memory cell 20 to which "0" is to be written is selected, the write pulse drive circuit 50 outputs a second electric pulse. "0" is written to only the memory cell which is applied with the electric pulse, while data of the memory cell which has not been applied with the electric pulse is kept at "1." Since switching only from the low-resistance state to the high-resistance state occurs, the high-resistance series current path and the high-resistance parallel current path in Embodiment 1 may be omitted. Therefore, the series resistance switching circuit 10 consists of the low-resistance series resistor 12, and the parallel resistance switching circuit 30 consist of the low-resistance parallel resistor 31. The other configuration is identical to that of Embodiment 1, including the resistance values of the current paths or the potentials, and therefore, a detailed explanation thereof is omitted. For example, the conditions to be satisfied by the resistance values and the voltages in this embodiment may be expressed as the formula (1) and the formula (5).

When the value to be written to the memory cell 20 is "1" in this embodiment, no electric pulse is applied and the resistance state of the resistance variable element 22 belonging to the memory cell 20 will not change. In this embodiment, it is assumed that even in such a case, "writing" has occurred.

[Operation]

Receiving an address of a memory cell 20 to which data is to be written and write data from an upstream system, the controller selects a specified memory cell 20 using the column decoder (not shown), the row decoder (not shown), and the like. At this time, the selection transistor 21 of the memory cell 20 is placed in an electrically-conductive state. When the write data is "0," the controller controls the write pulse drive circuit 50 to input a write pulse (first electric pulse) from the first output terminal 51 to the first terminal 91 to enable switching to the high-resistance state to occur. When the write data is "1," it is not necessary to change the resistance state, and therefore the controller applies no electric pulse to the memory cell 20. With this operation, data is stored in a "write once" manner. Since data is not written again to the memory cell 20 to which the data has been written once, data which has been written initially is thereafter preserved therein.

[Comparison with Embodiment 4]

The resistance variable memory apparatuses of Embodiment 4 and this embodiment are write once memories. The resistance variable memory apparatus of Embodiment 4 has a simpler configuration because of the omission of the parallel current path. In contrast, the resistance variable memory apparatus of Embodiment 5 has a complex configuration because of the presence of the parallel current path, but effectively improves reliability. Hereinafter, this advantage will be described.

Since there is a variation in the resistance values of the resistance variable elements 22 due to some factors such as non-uniformity occurring during manufacture and operation, a variation may occur in Rrh in some cases. Consider a variation of the node potential or the bit line potential which occurs in this case.

Consider a case (Case 1) in which the resistance value of the parallel current path is set to 30 k Ω and the resistance value of the series current path is set to 800Ω, in the case where the element is switched from the high-resistance state to the low-resistance state in this embodiment, as in Embodiment 1. The absolute value of the node potential in the case where the first electric pulse is applied in such a configuration is about 3.5V. On the other hand, consider a case (Case 2) in which the resistance value of the series current path is set to 20 kΩ so that the absolute value of the bit line potential becomes about 3.5V in Embodiment 4.

Figure 8:
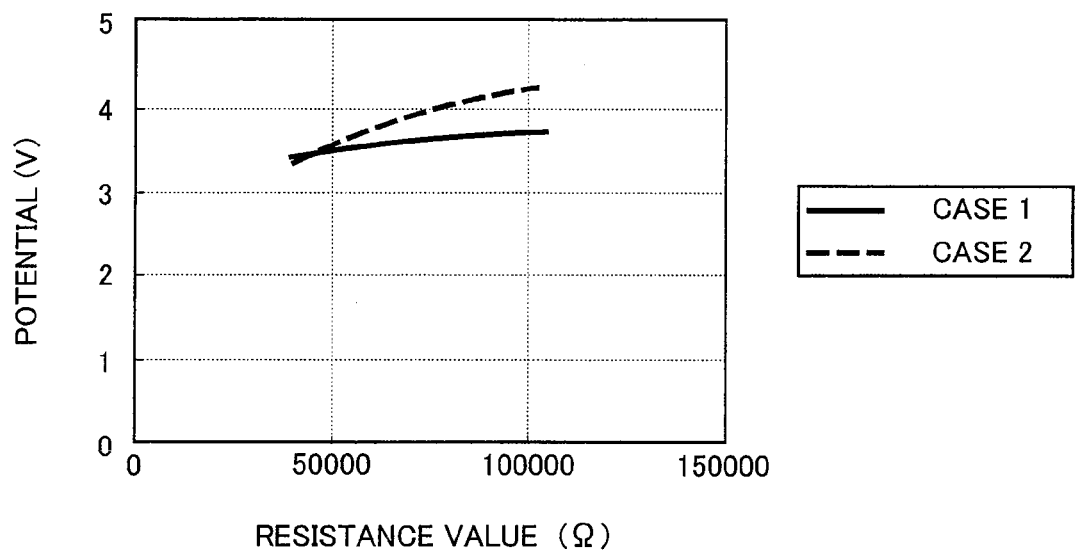
FIG. 8 is a graph showing the relationship between a resistance value Rrh, a node potential (Case 1) and a bit line potential (Case 2) under the condition in which other parameters are fixed in Case 1 and Case 2.
Figure 9:
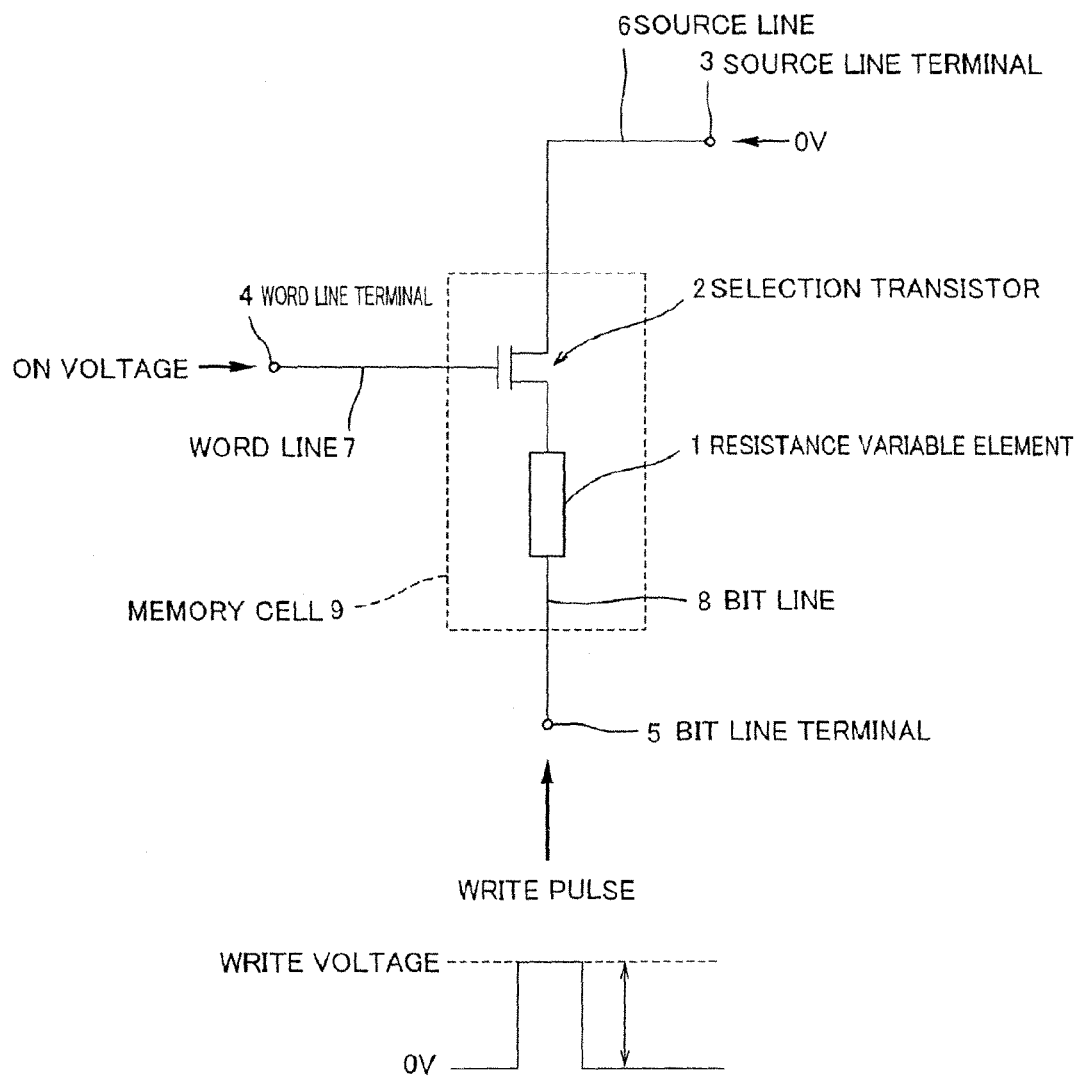
FIG. 9 is a view showing an application state of a voltage pulse during a write operation in a memory cell of Patent document 1.
Figure 10:
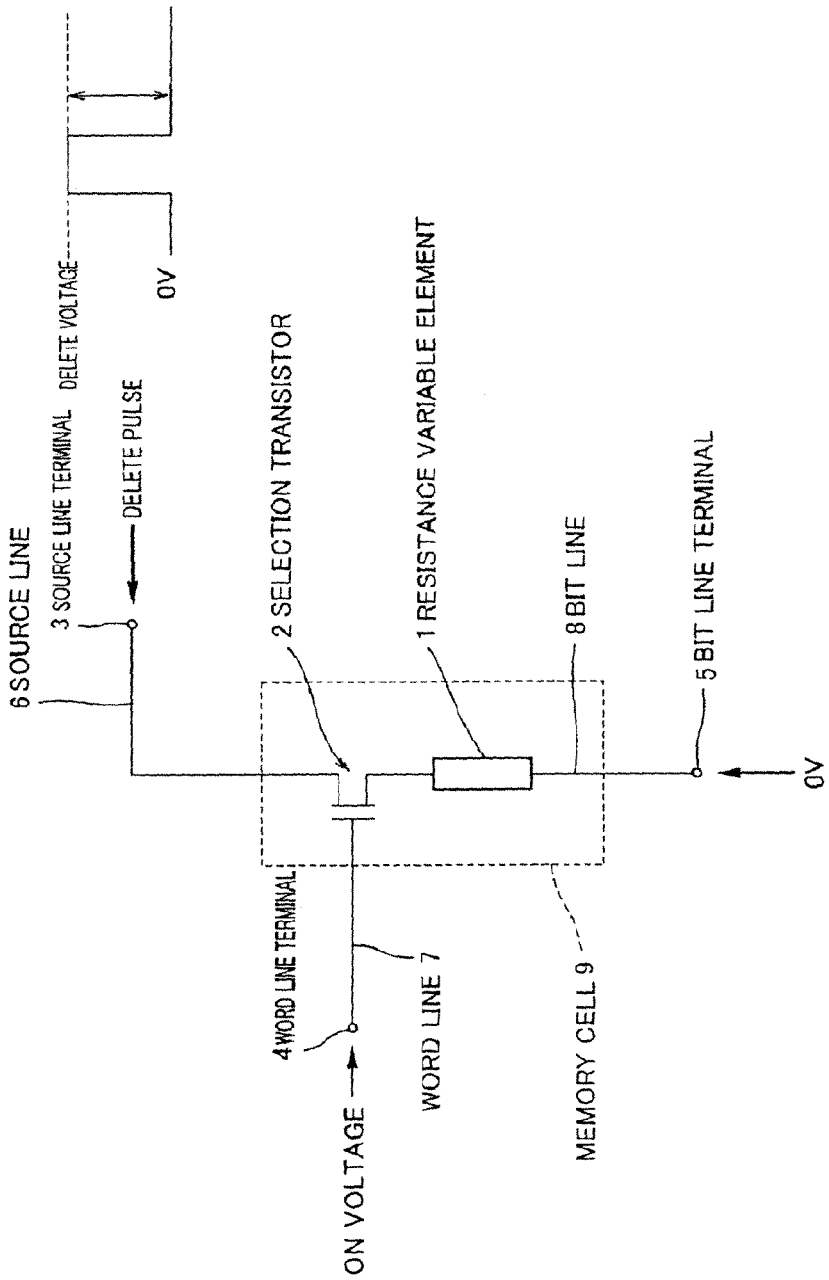
FIG. 10 is a view showing an application state of a voltage pulse during an erase operation in the memory cell of Patent document 1.
Figure 11:
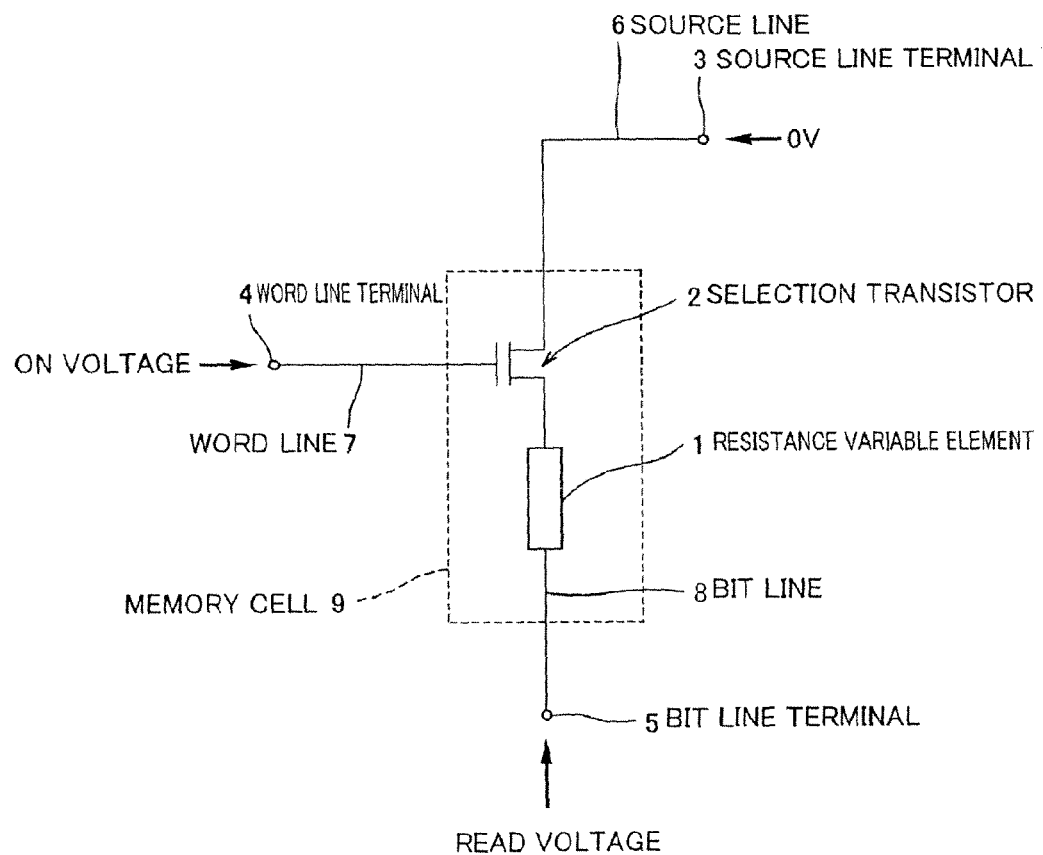
FIG. 11 is a view showing an application state of a voltage pulse during a read operation in the memory cell of Patent document 1.

FIG. 8 is a graph showing the relationship between a resistance value Rrh, a node potential (Case 1) and a bit line potential (Case 2) under the condition in which other parameters are fixed in Case 1 and Case 2. As shown in FIG. 8, the change in the potential (absolute value) occurring when Rrh changes is smaller in Case 1 than in Case 2. From this result, it is found that the variation in the potential is lessened relative to the variation in Rrh because of the presence of the parallel current path. Therefore, the absolute value of the node potential does not fluctuate significantly even if there is a variation in the resistance values of the resistance variable elements 22 due to some factors such as non-uniformity occurring during manufacture and operation. Therefore, the resistance variable elements 22 are less likely to be subjected to an excess stress, and thus, a life of the resistance variable elements 22 is prolonged. In this embodiment, reliability of resistance variable memory apparatus is further improved in this embodiment.

If there is a very small variation in resistance changes of manufactured devices, the parallel current path may be omitted. Which of the embodiments should be adopted is suitably selected by a manufacturer of the memory apparatus.

[Advantage]

Since the resistance variable memory apparatus of this embodiment is the write once memory apparatus, the switches in the series resistance switching circuit 10 or the parallel resistance switching circuit 30 are unnecessary and one kind of resistors are respectively provided. The resistance variable memory apparatus of this embodiment is capable of preventing the incorrect operation or break of the element when writing data with a simpler configuration than that of Embodiment 1 using the resistance variable element transitioning between plural resistance states in response to the electric pulses of the same polarity. In addition, because of the presence of the parallel current path, the absolute value of the node potential can be stabilized even if the resistance value of the resistance variable element fluctuates, and thus reliability can be improved.

[Modification]

The correspondence between the resistance states and data (value to be stored) is determined as descried. The high-resistance state may correspond to "1," and the low-resistance state may correspond to "0."

Having described above that switching only from the low-resistance state to the high-resistance state occurs, switching only from the high-resistance state to the low-resistance state may alternatively occur. In this case, the conditions to be satisfied by the resistance values and the voltages may be the formula (3) and the formula (4) (or formula (6)).

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable memory apparatus of the present invention is useful as a resistance variable memory apparatus which does not require erasing data all at once when writing data and can improve a processing speed. The resistance variable memory apparatus of the present invention is useful as a resistance variable memory apparatus which is capable of preventing an incorrect operation or break of an element when writing data with a simple configuration using a resistance variable element transitioning between plural resistance states in response to the electric pulses of the same polarity.

The invention claimed is:

1. A resistance variable memory apparatus comprising:
   a resistance variable element for storing data based on a change in an electric resistance;
   an electric pulse application device including a first output terminal and a second output terminal, the electric pulse application device being configured to output an electric pulse between the first output terminal and the second output terminal;
   a reference node;
   a series current path for electrically connecting the first output terminal to the reference node;
   a resistance change current path including the resistance variable element and electrically connecting the reference node to the second output terminal via the resistance variable element;
   a parallel current path for electrically connecting the reference node to the second output terminal in parallel with the resistance change current path;
   a series resistance setting unit for setting a resistance value of the series current path; and
   a parallel resistance setting unit for setting a resistance value of the parallel current path;
   wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level; and wherein the series resistance setting unit is configured to set a resistance value of the series current path and the parallel resistance setting unit is configured to set a resistance value of the parallel current path such that:

a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state, become resistance values at which the node potential is not smaller in absolute value than the first voltage level when the resistance variable element is in the low-resistance state and the electric pulse application device outputs a first electric pulse;

become resistance values at which the node potential is not smaller in absolute value than the second voltage level when the resistance variable element is in the high-resistance state and the electric pulse application device outputs a second electric pulse;

become resistance values at which the node potential is not larger in absolute value than the second voltage level in a state where the electric pulse application device is outputting the first electric pulse after the resistance variable element has switched to the high-resistance state when the resistance variable element is in the low-resistance state and the electric pulse application device outputs the first electric pulse; and become resistance values at which the node potential is not larger in absolute value than the first voltage level in a state where the electric pulse application device is outputting the second electric pulse after the resistance variable element has switched to the low-resistance state when the resistance variable element is in the high-resistance state and the electric pulse application device outputs the second electric pulse.

2. The resistance variable memory apparatus according to claim 1, wherein when a resistance value of the series current path which occurs when the resistance variable element is switched from the low-resistance state to the high-resistance state is expressed as Rsl, a resistance value of the series current path which occurs when the resistance variable element is switched from the high-resistance state to the low-resistance state is expressed as Rsh, a resistance value of the parallel current path which occurs when the resistance variable element is switched from the low-resistance state to the high-resistance state is expressed as Rpl, a resistance value of the parallel current path which occurs when the resistance variable element is switched from the high-resistance state to the low-resistance state is expressed as Rph, a resistance value of the resistance change current path which occurs in a state where the resistance variable element is in the low-resistance state is expressed as Rrl, a resistance value of the resistance change current path which occurs in a state where the resistance variable element is in the high-resistance state is expressed as Rrh, an absolute value of a potential of the first output terminal based on the second output terminal as a reference which occurs when the first electric pulse is output is expressed as V1, an absolute value of a potential of the first output terminal based on the second output terminal as a reference which occurs when the second electric pulse is output is expressed as V2, an absolute value of the first voltage level is expressed as Vlh, and an absolute value of the second voltage level is expressed as Vhl, formulae (1) to (4) expressed below are satisfied:

$$\frac{V1 \times Rpl - Vlh \times Rpl}{Vlh + \frac{Vlh \times Rpl}{Rrl}} \geq Rsl \quad (1)$$

$$\frac{V1 \times Rpl - Vhl \times Rpl}{Vhl + \frac{Vhl \times Rpl}{Rrh}} < Rsl \quad (2)$$

$$\frac{V2 \times Rph - Vhl \times Rph}{Vhl + \frac{Vhl \times Rph}{Rrh}} \geq Rsh \quad (3)$$

$$\frac{V2 \times Rph - Vlh \times Rph}{Vlh + \frac{Vlh \times Rph}{Rrl}} < Rsh. \quad (4)$$

3. The resistance variable memory apparatus according to claim 1, wherein the series resistance setting unit is configured to selectively turn on switches of a plurality of current paths which are provided on the series current path in parallel with each other, to set the resistance value of the series current path, the plurality of current paths each including a fixed resistance element and a switch; and the parallel resistance setting unit is configured to selectively turn on switches of a plurality of current paths which are provided on the series current path in parallel with each other, to set the resistance value of the parallel current path, the plurality of current paths each including a fixed resistance element and a switch.

4. The resistance variable memory apparatus according to claim 1, wherein the series resistance setting unit is configured to selectively turn on transistors included in a plurality of current paths which are provided on the series current path in parallel with each other, to set the resistance value of the series current path, the transistors having different ON-resistances; and the parallel resistance setting unit is configured to selectively turn on transistors included in a plurality of current paths which are provided on the series current path in parallel with each other, to set the resistance value of the parallel current path, the transistors having different ON-resistances.

5. The resistance variable memory apparatus according to claim 1, further comprising:

a controller;

wherein the controller is configured to control the series resistance setting unit and the parallel resistance setting unit based on a signal externally input, to set the resistance value of the series current path and the resistance value of the parallel current path, when the electric pulse application device outputs an electric pulse.

6. A write once resistance variable memory apparatus comprising:
a resistance variable element for storing data based on a change in an electric resistance;
an electric pulse application device including a first output terminal and a second output terminal, the electric pulse application device being configured to output an electric pulse between the first output terminal and the second output terminal;
a reference node;
a series current path for electrically connecting the first output terminal to the reference node;
a resistance change current path including the resistance variable element and electrically connecting the reference node to the second output terminal via the resistance variable element; and
a parallel current path for electrically connecting the reference node to the second output terminal in parallel with the resistance change current path;
wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level;
wherein a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state,
become resistance values at which the node potential is not smaller in absolute value than the first voltage level when the resistance variable element is in the low-resistance state and the electric pulse application device outputs a first electric pulse; and
become resistance values at which the node potential is not larger in absolute value than the second voltage level in a state where the electric pulse application device is outputting the first electric pulse after the resistance variable element has switched to the high-resistance state when the resistance variable element is in the low-resistance state and the electric pulse application device outputs the first electric pulse.

7. A write once resistance variable memory apparatus comprising:
a resistance variable element for storing data based on a change in an electric resistance;
an electric pulse application device including a first output terminal and a second output terminal, the electric pulse application device being configured to output an electric pulse between the first output terminal and the second output terminal;
a reference node,
a series current path for electrically connecting the first output terminal to the reference node;
a resistance change current path including the resistance variable element and electrically connecting the reference node to the second output terminal via the resistance variable element; and
a parallel current path for electrically connecting the reference node to the second output terminal in parallel with the resistance change current path;
wherein the resistance variable element has a characteristic in which the resistance variable element in a low-resistance state switches to a high-resistance state, a resistance value of which is higher than a resistance value of the low-resistance state, when a node potential which is a potential of the reference node based on the second output terminal as a reference is larger in absolute value than a first voltage level, and the resistance variable element in the high-resistance state switches from the high-resistance state to the low-resistance state when the node potential is larger in absolute value than a second voltage level which has a polarity identical to a polarity of the first voltage level and is larger in absolute value than the first voltage level;
wherein a resistance value of the series current path, a resistance value of the parallel current path, a resistance value of the resistance change current path in a state where the resistance variable element is in the high-resistance state, and a resistance value of the resistance change current path in a state where the resistance variable element is in the low-resistance state,
become resistance values at which the node potential is not smaller in absolute value than the second voltage level when the resistance variable element is in the high-resistance state and the electric pulse application device outputs a second electric pulse; and
become resistance values at which the node potential is not larger in absolute value than the first voltage level in a state where the electric pulse application device is outputting the second electric pulse after the resistance variable element has switched to the low-resistance state when the resistance variable element is in the high-resistance state and the electric pulse application device outputs the second electric pulse.

8. A write once resistance variable memory apparatus comprising:
a resistance variable element including a first resistance terminal and a second resistance terminal, the resistance variable element being configured to store data based on a change in an electric resistance between the first resistance terminal and the second resistance terminal;
an electric pulse application device including a first output terminal and a second output terminal, the electric pulse application device being configured to output an electric pulse between the first output terminal and the second output terminal;
a series current path for electrically connecting the first output terminal to the first resistance terminal; and
a resistance change current path including the resistance variable element and electrically connecting the first resistance terminal to the second output terminal via the resistance variable element;
wherein the resistance variable element has a characteristic in which the resistance variable element in a high-resistance state switches to a low-resistance state, a resistance value of which is lower than a resistance value of the high-resistance state, when a potential at a predetermined point on the series current path based on the second output terminal as a reference is larger in absolute value than a third voltage level, and the resistance variable element in the low-resistance state switches from the low-resistance state to the high-resistance state when the potential is larger in absolute value than a fourth voltage level which has a polarity identical to a polarity of the third voltage level and is smaller in absolute value than the third voltage level; and wherein when a resistance value of the series current path is expressed as Rs, a resistance value of the resistance change current path in a state where the resistance variable element is in the low-resistance state is expressed as Rrl, a resistance value of the resistance change current path in a state where the resistance variable element is in the high-resistance state is expressed as Rrh, an absolute value of a potential of the first output terminal based on the second output terminal as a reference which occurs when a third electric pulse is output, is expressed as V3, an absolute value of the third voltage level is expressed as Vhl', and an absolute value of the fourth voltage level is expressed as Vlh', a formula (7) and a formula (8) expressed below are satisfied:

$$\frac{(V3 - Vhl') \times Rrh'}{Vhl'} \geq Rs \quad (7)$$

$$\frac{(V3 - Vlh') \times Rrl'}{Vlh'} < Rs. \quad (8)$$

\* \* \* \* \*